(12) United States Patent
Yamada et al.

(10) Patent No.: US 8,687,321 B2
(45) Date of Patent: Apr. 1, 2014

(54) MAGNETIC HEAD ASSEMBLY

(75) Inventors: Kenichiro Yamada, Tokyo (JP); Hitoshi Iwasaki, Kanagawa-ken (JP); Masayuki Takagishi, Tokyo (JP); Tomomi Funayama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 955 days.

(21) Appl. No.: 12/382,940

(22) Filed: Mar. 26, 2009

(65) Prior Publication Data
US 2009/0316303 A1 Dec. 24, 2009

(30) Foreign Application Priority Data
Jun. 19, 2008 (JP) ................................ 2008-161025

(51) Int. Cl.
*G11B 5/60* (2006.01)

(52) U.S. Cl.
USPC ................ 360/125.3; 360/324.12; 428/811.2; 428/811.5; 428/812; 428/815

(58) Field of Classification Search
None
See application file for complete search history.

(56) References Cited

U.S. PATENT DOCUMENTS

| | | |
|---|---|---|
| 3,899,834 A | 8/1975 | Harrison, Jr. |
| 4,103,315 A | 7/1978 | Hempstead et al. |
| 4,782,415 A | 11/1988 | Vinal |
| 4,945,528 A | 7/1990 | Crasemann |
| 5,499,150 A | 3/1996 | Kawana et al. |
| 5,695,864 A | 12/1997 | Slonczewski |
| 5,748,399 A | 5/1998 | Gill |
| 5,768,066 A | 6/1998 | Akiyama et al. |
| 5,898,546 A | 4/1999 | Kanai et al. |
| 5,920,447 A | 7/1999 | Sakata et al. |
| 6,011,664 A | 1/2000 | Kryder et al. |
| 6,094,328 A | 7/2000 | Saito |
| 6,153,062 A | 11/2000 | Saito |
| 6,278,576 B1 | 8/2001 | Ogata et al. |
| 6,282,069 B1 | 8/2001 | Nakazawa et al. |
| 6,519,119 B1 | 2/2003 | van der Heijden et al. |
| 6,580,589 B1 | 6/2003 | Gill |

(Continued)

FOREIGN PATENT DOCUMENTS

| | | |
|---|---|---|
| JP | 64-070947 | 3/1989 |
| JP | 05-20635 | 1/1993 |

(Continued)

OTHER PUBLICATIONS

Park et al. (IEEE Trans. Mag., v42(10), 2006, 2639-2641).*

(Continued)

*Primary Examiner* — Kevin Bernatz
(74) *Attorney, Agent, or Firm* — Nixon & Vanderhye, P.C.

(57) ABSTRACT

A magnetic head assembly includes: a magnetic recording head, a head slider, a suspension and an actuator arm. The magnetic recording head includes a spin torque oscillator and a main magnetic pole. The spin torque oscillator includes, a first magnetic layer including at least one selected from the group consisting of a Fe—Co—Al alloy, a Fe—Co—Si alloy, a Fe—Co—Ge alloy, a Fe—Co—Mn alloy a Fe—Co—Cr alloy and a Fe—Co—B alloy, a second magnetic layer, and an intermediate layer provided between the first magnetic layer and the second magnetic layer. The main magnetic pole is placed together with the spin torque oscillator. The magnetic recording head is mounted on the head slider. The head slider is mounted on one end of the suspension. The actuator arm is connected to other end of the suspension.

9 Claims, 11 Drawing Sheets

(56) References Cited

U.S. PATENT DOCUMENTS

| | | | |
|---|---|---|---|
| 6,583,969 B1 | 6/2003 | Pinarbasi | |
| 6,591,479 B2 | 7/2003 | Nakazawa et al. | |
| 6,608,739 B1 | 8/2003 | Tanaka et al. | |
| 6,621,664 B1 | 9/2003 | Trindade et al. | |
| 6,697,231 B1 | 2/2004 | Kikuiri | |
| 6,785,092 B2 | 8/2004 | Covington et al. | |
| 6,809,900 B2 | 10/2004 | Covington | |
| 6,836,971 B1 | 1/2005 | Wan | |
| 6,927,952 B2 | 8/2005 | Shimizu et al. | |
| 6,937,446 B2 | 8/2005 | Kamiguchi et al. | |
| 6,977,108 B2 | 12/2005 | Hieda et al. | |
| 6,980,469 B2 | 12/2005 | Kent et al. | |
| 6,982,845 B2 | 1/2006 | Kai et al. | |
| 7,106,555 B2 | 9/2006 | Kikuiri et al. | |
| 7,119,990 B2 | 10/2006 | Bajorek et al. | |
| 7,120,988 B2 | 10/2006 | Le et al. | |
| 7,145,752 B2 | 12/2006 | Ueda et al. | |
| 7,154,707 B2 | 12/2006 | Watabe et al. | |
| 7,256,955 B2 | 8/2007 | Pokhil et al. | |
| 7,397,633 B2 | 7/2008 | Xue et al. | |
| 7,461,933 B2 | 12/2008 | Deily et al. | |
| 7,466,525 B2 | 12/2008 | Hasegawa et al. | |
| 7,471,491 B2 | 12/2008 | Sato et al. | |
| 7,473,478 B2* | 1/2009 | Sbiaa et al. | 428/693.1 |
| 7,486,475 B2 | 2/2009 | Biskeborn | |
| 7,504,898 B2 | 3/2009 | Fukuzawa et al. | |
| 7,532,433 B2 | 5/2009 | Kawato et al. | |
| 7,532,434 B1 | 5/2009 | Schreck et al. | |
| 7,593,185 B2 | 9/2009 | Yazawa | |
| 7,616,412 B2 | 11/2009 | Zhu et al. | |
| 7,675,129 B2* | 3/2010 | Inomata et al. | 257/421 |
| 7,724,469 B2* | 5/2010 | Gao et al. | 360/125.3 |
| 7,732,881 B2* | 6/2010 | Wang | 257/421 |
| 7,764,136 B2 | 7/2010 | Suzuki | |
| 7,791,829 B2 | 9/2010 | Takeo et al. | |
| 7,808,330 B2 | 10/2010 | Fukuzawa et al. | |
| 7,818,890 B2 | 10/2010 | Duric et al. | |
| 7,876,531 B2 | 1/2011 | Bozeman et al. | |
| 7,911,882 B2 | 3/2011 | Shimazawa et al. | |
| 7,957,098 B2* | 6/2011 | Yamada et al. | 360/125.3 |
| 8,081,397 B2 | 12/2011 | Funayama et al. | |
| 8,139,322 B2 | 3/2012 | Yamada et al. | |
| 8,154,825 B2 | 4/2012 | Takashita et al. | |
| 8,164,854 B2 | 4/2012 | Takagishi et al. | |
| 8,238,058 B2 | 8/2012 | Shimizu et al. | |
| 8,238,060 B2 | 8/2012 | Yamada et al. | |
| 8,264,799 B2 | 9/2012 | Akiyama et al. | |
| 8,270,112 B2 | 9/2012 | Funayama et al. | |
| 8,295,009 B2 | 10/2012 | Yamada et al. | |
| 8,320,079 B2 | 11/2012 | Iwasaki et al. | |
| 8,325,442 B2* | 12/2012 | Koui et al. | 360/128 |
| 8,400,734 B2 | 3/2013 | Yamada et al. | |
| 8,467,148 B2* | 6/2013 | Iwasaki et al. | 360/110 |
| 8,547,662 B2 | 10/2013 | Yamada et al. | |
| 2001/0017746 A1 | 8/2001 | Nishida et al. | |
| 2001/0017752 A1 | 8/2001 | Hoshiya et al. | |
| 2002/0006013 A1 | 1/2002 | Sato et al. | |
| 2002/0014016 A1 | 2/2002 | Kato | |
| 2002/0051330 A1 | 5/2002 | Heijden et al. | |
| 2002/0075595 A1 | 6/2002 | Sato et al. | |
| 2002/0097536 A1 | 7/2002 | Komuro et al. | |
| 2002/0136927 A1 | 9/2002 | Hieda et al. | |
| 2002/0155321 A1 | 10/2002 | Kawasaki et al. | |
| 2003/0026040 A1* | 2/2003 | Covington et al. | 360/126 |
| 2003/0090844 A1 | 5/2003 | Shimizu et al. | |
| 2004/0070869 A1 | 4/2004 | Nishida et al. | |
| 2004/0145828 A1 | 7/2004 | Im | |
| 2004/0150912 A1 | 8/2004 | Kawato et al. | |
| 2004/0190197 A1 | 9/2004 | Watabe et al. | |
| 2004/0228045 A1 | 11/2004 | Hasegawa et al. | |
| 2004/0252417 A1 | 12/2004 | Hasegawa et al. | |
| 2005/0023938 A1 | 2/2005 | Sato et al. | |
| 2005/0088789 A1 | 4/2005 | Hou et al. | |
| 2005/0105213 A1 | 5/2005 | Takeo et al. | |
| 2005/0110004 A1 | 5/2005 | Parkin et al. | |
| 2005/0111137 A1 | 5/2005 | Ju et al. | |
| 2005/0193578 A1 | 9/2005 | Toda | |
| 2005/0207050 A1 | 9/2005 | Pokhil | |
| 2005/0219767 A1 | 10/2005 | Nakamura et al. | |
| 2005/0219771 A1* | 10/2005 | Sato et al. | 360/324.2 |
| 2006/0039089 A1 | 2/2006 | Sato | |
| 2006/0171051 A1 | 8/2006 | Wachenschwanz et al. | |
| 2006/0187580 A1 | 8/2006 | Samofalov et al. | |
| 2006/0198047 A1 | 9/2006 | Xue et al. | |
| 2006/0213070 A1 | 9/2006 | Goldsobel et al. | |
| 2006/0221507 A1 | 10/2006 | Sato et al. | |
| 2007/0063237 A1 | 3/2007 | Huai et al. | |
| 2007/0089311 A1 | 4/2007 | Amundson et al. | |
| 2007/0109147 A1 | 5/2007 | Fukuzawa et al. | |
| 2007/0253122 A1 | 11/2007 | Fukuzawa et al. | |
| 2008/0019040 A1 | 1/2008 | Zhu et al. | |
| 2008/0112087 A1 | 5/2008 | Clinton et al. | |
| 2008/0117545 A1 | 5/2008 | Batra et al. | |
| 2008/0129401 A1 | 6/2008 | Fukuzawa et al. | |
| 2008/0137224 A1 | 6/2008 | Gao et al. | |
| 2008/0144232 A1 | 6/2008 | Kaka et al. | |
| 2008/0150643 A1 | 6/2008 | Suzuki et al. | |
| 2008/0165452 A1 | 7/2008 | Bozeman et al. | |
| 2008/0180838 A1 | 7/2008 | Im et al. | |
| 2008/0208733 A1 | 8/2008 | Robb et al. | |
| 2008/0218891 A1 | 9/2008 | Gubbins et al. | |
| 2008/0231998 A1 | 9/2008 | Yoshikawa et al. | |
| 2008/0268291 A1 | 10/2008 | Akiyama et al. | |
| 2008/0304176 A1 | 12/2008 | Takagishi et al. | |
| 2009/0052095 A1 | 2/2009 | Yamada et al. | |
| 2009/0059417 A1* | 3/2009 | Takeo et al. | 360/75 |
| 2009/0059418 A1 | 3/2009 | Takeo et al. | |
| 2009/0059423 A1* | 3/2009 | Yamada et al. | 360/122 |
| 2009/0080105 A1 | 3/2009 | Takashita et al. | |
| 2009/0080106 A1 | 3/2009 | Shimizu et al. | |
| 2009/0080109 A1 | 3/2009 | Fukuzawa et al. | |
| 2009/0080120 A1 | 3/2009 | Funayama et al. | |
| 2009/0088095 A1 | 4/2009 | Kayano et al. | |
| 2009/0097167 A1 | 4/2009 | Sato et al. | |
| 2009/0097169 A1 | 4/2009 | Sato et al. | |
| 2009/0115541 A1 | 5/2009 | Persson et al. | |
| 2009/0225465 A1* | 9/2009 | Iwasaki et al. | 360/75 |
| 2009/0257151 A1 | 10/2009 | Zhang et al. | |
| 2009/0262457 A1 | 10/2009 | Rivkin et al. | |
| 2009/0316303 A1 | 12/2009 | Yamada et al. | |
| 2009/0316304 A1 | 12/2009 | Funayama et al. | |
| 2010/0007992 A1 | 1/2010 | Yamada et al. | |
| 2010/0007996 A1 | 1/2010 | Iwasaki et al. | |
| 2010/0027158 A1 | 2/2010 | Takagishi et al. | |
| 2010/0110592 A1 | 5/2010 | Koui et al. | |
| 2010/0134922 A1 | 6/2010 | Yamada et al. | |
| 2010/0220415 A1 | 9/2010 | Yamada et al. | |
| 2011/0038080 A1* | 2/2011 | Alex et al. | 360/123.02 |
| 2011/0205655 A1 | 8/2011 | Shimizu et al. | |
| 2011/0299192 A1 | 12/2011 | Yamada et al. | |
| 2011/0300409 A1 | 12/2011 | Yamada et al. | |
| 2012/0268844 A1 | 10/2012 | Yamada et al. | |
| 2012/0275060 A1 | 11/2012 | Shimizu et al. | |

FOREIGN PATENT DOCUMENTS

| | | |
|---|---|---|
| JP | 07-244801 | 9/1995 |
| JP | 11-154609 | 6/1999 |
| JP | 2001-243602 | 9/2001 |
| JP | 2002-100005 | 4/2002 |
| JP | 2002-109712 | 4/2002 |
| JP | 2002-208744 | 7/2002 |
| JP | 2002-217029 | 8/2002 |
| JP | 2002-279616 | 9/2002 |
| JP | 2003-317220 | 11/2003 |
| JP | 2004-192744 | 7/2004 |
| JP | 2004-207707 | 7/2004 |
| JP | 2004-221298 | 8/2004 |
| JP | 2004-234830 | 8/2004 |
| JP | 2004-295987 | 10/2004 |
| JP | 2005-108315 | 4/2005 |
| JP | 2005-525663 | 8/2005 |
| JP | 2005-285242 | 10/2005 |
| JP | 2005-294376 | 10/2005 |

(56) References Cited

FOREIGN PATENT DOCUMENTS

| | | |
|---|---|---|
| JP | 2005-310363 | 11/2005 |
| JP | 2006-080385 | 3/2006 |
| JP | 2006-086508 | 3/2006 |
| JP | 2006-134540 | 5/2006 |
| JP | 2006-147023 | 6/2006 |
| JP | 2006-209960 | 8/2006 |
| JP | 2006-209964 | 8/2006 |
| JP | 2006-244693 | 9/2006 |
| JP | 2006-286855 | 10/2006 |
| JP | 3833512 | 10/2006 |
| JP | 2007-012264 | 1/2007 |
| JP | 2007-035251 | 2/2007 |
| JP | 2007-116003 | 5/2007 |
| JP | 2007-124340 | 5/2007 |
| JP | 2007-184923 | 7/2007 |
| JP | 2007-193906 | 8/2007 |
| JP | 2007-299880 | 11/2007 |
| JP | 2008-109118 | 5/2008 |
| JP | 2008-123669 | 5/2008 |
| JP | 2008-176908 | 7/2008 |
| JP | 2009-070439 | 4/2009 |
| JP | 2009-070541 | 4/2009 |
| JP | 2010-003354 | 1/2010 |
| KR | 1020030039289 | 5/2003 |
| WO | 2006-101040 | 9/2006 |

OTHER PUBLICATIONS

Shen et al. (App. Phys. Let., 88, 2006, 182508-1-3).*
Xiaochun Zhu et al., "Bias-Field-Free Microwave Oscillator Driven by Perpendicularly Polarized Spin Current"; IEEE Transaction on Magnetics, vol. 42, No. 10, pp. 2670, Oct. 2006.
Jian-Gang Zhu et al., "Micromagnetic Assisted Magnetic Recording (MAMR)"; The Magnetic Recording Conference (TMRC2007), B6, pp. 34-35, May 21, 2007.
S. Maat et al., "Magnetotransport properties and spin-torque effects in current perpendicular to the plane spin valves with Co-Fe-Al magnetic layers", Journal of Applied Physics 101, 093905 (2007); May 9, 2007.
Akiyama et al., U.S. Appl. No. 12/109,760, filed Apr. 25, 2008.
Yamada et al., U.S. Appl. No. 12/153,490, filed May 20, 2008.
Yamada et al., U.S. Appl. No. 12/155,329, filed Jun. 2, 2008.
Takagishi et al., U.S. Appl. No. 12/155,473, filed Jun. 4, 2008.
Takeo et al., U.S. Appl. No. 12/196,628, filed Aug. 22, 2008.
Takeo et al., U.S. Appl. No. 12/196,841, filed Aug. 22, 2008.
Iwasaki et al., U.S. Appl. No. 12/232,014, filed Sep. 9, 2008.
Takashita et al., U.S. Appl. No. 12/232,391, filed Sep. 16, 2008.
Funayama et al., U.S. Appl. No. 12/232,392, filed Sep. 16, 2008.
Shimizu et al., U.S. Appl. No. 12/232,469, filed Sep. 17, 2008.
Yamada et al., U.S. Appl. No. 12/780,269, filed May 13, 2010.
Yamada et al., U.S. Appl. No. 13/214,012, filed Aug. 19, 2011.
Yamada et al., U.S. Appl. No. 13/214,033, filed Aug. 19, 2011.
Tang et al., "Narrow Track Confinement by AC Field Generation Layer in Microwave Assisted Magnetic Recording", IEEE Transactions of Magnetics, vol. 44, Issue 11, pp. 3376-3379 (Nov. 2008).
Iwasaki et al., U.S. Appl. No. 12/457,657, filed Jun. 17, 2009.
Takagishi et al., U.S. Appl. No. 12/461,027, filed Jul. 29, 2009.
Koui et al., U.S. Appl. No. 12/591,055, filed Nov. 5, 2009.
Shimizu et al., U.S. Appl. No. 12/737,691, filed Feb. 7, 2011.
Office Action dated Jun. 4, 2013 in JP Application No. 2008-161025 with English-language translation thereof.
Yamada et al., U.S. Appl. No. 13/541,371, filed Jul. 3, 2012.
Office Action dated Sep. 19, 2012 in JP Application No. 2008-161025 and English-language translation thereof.
English-language machine translation of JP11-154609.
Takeo et al., U.S. Appl. No. 12/196,841, filed Aug. 22, 2008—now abandoned.
Iwasaki et al., U.S. Appl. No. 12/232,014, filed Sep. 9, 2008—now abandoned.
Shimizu et al., U.S. Appl. No. 12/232,469, filed Sep. 17, 2008—now abandoned.
Takagishi et al., U.S. Appl. No. 12/461,027, filed Jul. 29, 2009—non-final office action mailed Oct. 4, 2013.
Takagishi et al., U.S. Appl. No. 13/071,681, filed Mar. 25, 2011—now abandoned.
Shimizu et al., U.S. Appl. No. 13/545,601, Jul. 10, 2012—allowed.
Yamada et al., U.S. Appl. No. 13/966,126, filed Aug. 13, 2013—restriction requirement mailed Oct. 10, 2013.
Shimizu et al., U.S. Appl. No. 13/545,601, filed Jul. 10, 2012.
Funayama et al., U.S. Appl. No. 12/457,674, filed Jun. 18, 2009.
Takagishi et al., U.S. Appl. No. 13/071,681, filed Mar. 25, 2011.

* cited by examiner

MAGNETIC HEAD ASSEMBLY

CROSS-REFERENCE TO RELATED APPLICATIONS

This application is based upon and claims the benefit of priority from the prior Japanese Patent Application No. 2008-161025, filed on Jun. 19, 2008; the entire contents of which are incorporated herein by reference.

BACKGROUND OF THE INVENTION

This invention relates to a magnetic head assembly.

Background Art

In the 1990s, practical application of MR (Magneto-Resistive effect) head and GMR (Giant Magneto-Resistive effect) head has acted as a trigger and recording density and recording capacity of HDD (Hard Disk Drive) have drastically increased. However, in the 2000s, the problem of thermal fluctuation of the magnetic recording media has been actualized and therefore the speed of the increase of the recording density has temporarily slowed down. Even so, it has played a leading role that perpendicular magnetic recording, which is fundamentally more advantageous than the longitudinal magnetic recording in high-density recording, has been put into practical use in 2005, and nowadays, the recording density of HDD has been grown by about 40% per year.

In the latest recording density verification test, the level of more than 400 Gbits/inch$^2$ has been achieved, and if the recording density steadily develops continuously, it has been anticipated that the recording density of 1 Tbits/inch$^2$ will be realized in about 2012. However, it is thought that realization of such high recording density is not easy even by using the perpendicular magnetic recording scheme because the problem of thermal fluctuation is actualized again.

As a recording scheme that can solve such a problem, "high-frequency magnetic-field assist recording scheme" has been proposed (for example, U.S. Pat. No. 6,011,664, hereinafter referred to as Patent document 1). In the high-frequency magnetic-field assist recording scheme, a high-frequency magnetic field in the vicinity of resonant frequency of the magnetic recording medium which is sufficiently higher than recording signal frequency is applied locally to the medium. As a result, the medium resonates and the coercitivity (Hc) of the medium of a portion where the high-frequency magnetic field is applied decreases to half or less of its original coercivity. By utilizing this effect to superpose the recording magnetic field on high-frequency magnetic field, magnetic recording on the medium of higher coercitivity (Hc) and higher magnetic anisotropic energy (Ku) becomes possible. However, in the technique disclosed in the Patent document 1, the high-frequency magnetic field is generated by a coil and therefore it has been difficult to efficiently apply the high-frequency magnetic field to the medium.

Accordingly, as a means for generating the high-frequency magnetic field, techniques for utilizing a spin torque oscillator have been proposed (for example, US Patent Application Publications No. 2005/0023938, No. 2005/0219771, and No. 2008/0019040A1, hereinafter referred to as Patent documents 2 to 4, respectively and IEEE TRANSACTION ON MAGNETICS, VOL. 42, NO. 10, PP. 2670 "Bias-Field-Free Microwave Oscillator Driven by Perpendicularly Polarized Spin Current" by Xiaochun Zhu and Sian-Gang Zhu, hereinafter referred to as Non-patent document 1). In the techniques disclosed therein, the spin torque oscillator is composed of a spin injection layer, an intermediate layer, a magnetic layer, and an electrode. When a direct current is passed through the spin torque oscillator via the electrode, magnetization of the magnetic layer generates ferromagnetic resonance by spin torque generated by the spin injection layer. As a result, the high-frequency magnetic field is generated from the spin torque oscillator.

The size of the spin torque oscillator is about several tens of nanometers and therefore the generated high-frequency magnetic field is localized in the region of about several ten of nanometers in the vicinity of the spin torque oscillator. Furthermore, by the longitudinal component of the high-frequency magnetic field, the perpendicularly magnetized medium can be efficiently resonated and the coercitivity of the medium can be drastically lowered. As a result, only in a portion where the recording magnetic field by the -main magnetic pole and the high-frequency magnetic field by the spin torque oscillator are superposed, the high-density magnetic recording is performed, and the medium of high coercitivity (Hc) and high magnetic anisotropic energy (Ku) can be utilized. Therefore, the problem of thermal fluctuation in the high-density recording can be avoided.

For realizing the high-frequency magnetic-field assist recording head, it becomes important to design and fabricate the spin torque oscillator which enables the oscillation to be performed stably with a low driving current and enables the longitudinal high-frequency magnetic field sufficiently resonating the medium magnetization to be generated.

The maximum current density that can be passed through the spin torque oscillator is $2 \times 10^8$ A/cm$^2$ when the element size is, for example, about 70 nm. If the current density is more than this, the characteristics are degraded by, for example, heat generation and migration of the spin torque oscillator. Therefore, it becomes important to design the spin torque oscillator that can oscillate with as low current density as possible.

On the other hand, it has been reported that for sufficiently resonating the medium magnetization, it is desirable to set the intensity of the longitudinal high-frequency magnetic field to be 10% or more of the anisotropic magnetic field (Hk) of the medium (for example, TMRC B6(2007), "Microwave Assisted Magnetic Recording MAMR by Jian-Gang (Jimmy) Zhu and Xiaochun Zhu, hereinafter referred to as Non-patent document 2). Mechanisms for enhancing the intensity of the longitudinal high-frequency magnetic field includes increase of saturation magnetization of the oscillation layer, increase of layer thickness of the oscillation layer, increase of rotation angle of magnetization of the oscillation layer, and so forth. However, every mechanism thereof comes to make the driving current increase.

As described above, lowering of current density of the driving current and increasing of intensity of the longitudinal high-frequency magnetic field have a trade-off relation, and realization of the spin torque oscillator realizing these simultaneously is desired.

In US Patent Application Publication No. 2005/0110004, hereinafter referred to as Patent document 5, an example of using a FeCoAl alloy for a free layer in longitudinal magnetization type memory application by utilizing TMR has been disclosed. In US Patent Application Publication No. 2007/0063237, hereinafter referred to as Patent document 6, an example of utilizing a Heusler alloy has been disclosed. In JOURNAL OF APPLIED PHYSICS 101 093905 (2007), hereinafter referred to as Non-patent document 3, an example of using FeCoAl in longitudinal magnetization film CPP-GMR head application has been disclosed.

SUMMARY OF THE INVENTION

According to an aspect of the invention, there is provided a magnetic head assembly including: a magnetic recording head including: a spin torque oscillator including, a first magnetic layer including at least one selected from the group consisting of a Fe—Co—Al alloy, a Fe—Co—Si alloy, a Fe—Co—Ge alloy, a Fe—Co—Mn alloy a Fe—Co—Cr alloy and a Fe—Co—B alloy, a second magnetic layer, and an intermediate layer provided between the first magnetic layer and the second magnetic layer; and a main magnetic pole placed together with the spin torque oscillator; a head slider, the magnetic recording head being mounted on the head slider; a suspension, the head slider being mounted on one end of the suspension; and an actuator arm connected to other end of the suspension.

According to another aspect of the invention, there is provided a magnetic head assembly including: a magnetic recording head including: a spin torque oscillator including, a first magnetic layer; a second magnetic layer; and an intermediate layer provided between the first magnetic layer and the second magnetic layer, the second magnetic layer including at least one selected from the group consisting of a Fe—Co—Al alloy, a Fe—Co—Si alloy, a Fe—Co—Ge alloy, a Fe—Co—Mn alloy a Fe—Co—Cr alloy and a Fe—Co—B alloy at an interface between the second magnetic layer and the intermediate layer; and a main magnetic pole placed together with the spin torque oscillator; a head slider, the magnetic recording head being mounted on the head slider; a suspension, the head slider being mounted on one end of the suspension; and an actuator arm connected to other end of the suspension.

According to another aspect of the invention, there is provided a magnetic head assembly including a magnetic recording head including: a spin torque oscillator including, a first magnetic layer, a second magnetic layer, and an intermediate layer provided between the first magnetic layer and the second magnetic layer, a first magnetic layer including at least one selected from the group consisting of a Fe—Co—Al alloy, a Fe—Co—Si alloy, a Fe—Co—Ge alloy, a Fe—Co—Mn alloy a Fe—Co—Cr alloy and a Fe—Co—B alloy, the second magnetic layer including at least one selected from the group consisting of a Fe—Co—Al alloy, a Fe—Co—Si alloy, a Fe—Co—Ge alloy, a Fe—Co—Mn alloy a Fe—Co—Cr alloy and a Fe—Co—B alloy at an interface between the second magnetic layer and the intermediate layer; and a main magnetic pole placed together with the spin torque oscillator; a head slider, the magnetic recording head being mounted on the head slider; a suspension, the head slider being mounted on one end of the suspension; and an actuator arm connected to other end of the suspension.

DETAILED DESCRIPTION OF THE INVENTION

Hereinafter, embodiments of the invention will be described with reference to drawings.

The drawings are schematic or conceptual. And, relation of thickness to width of each of components, specific coefficient of scales of members, and so, forth are not necessarily the same as the actual ones. Moreover, even when the same portions are shown, the scales or specific coefficients are occasionally shown to be different from each other by the drawings.

Moreover, in the specification and each of the drawings, the same signs will be appended to the same components as described with respect to a previously presented figure, and the detailed description thereof will be appropriately omitted.

First Embodiment

Figure 1:
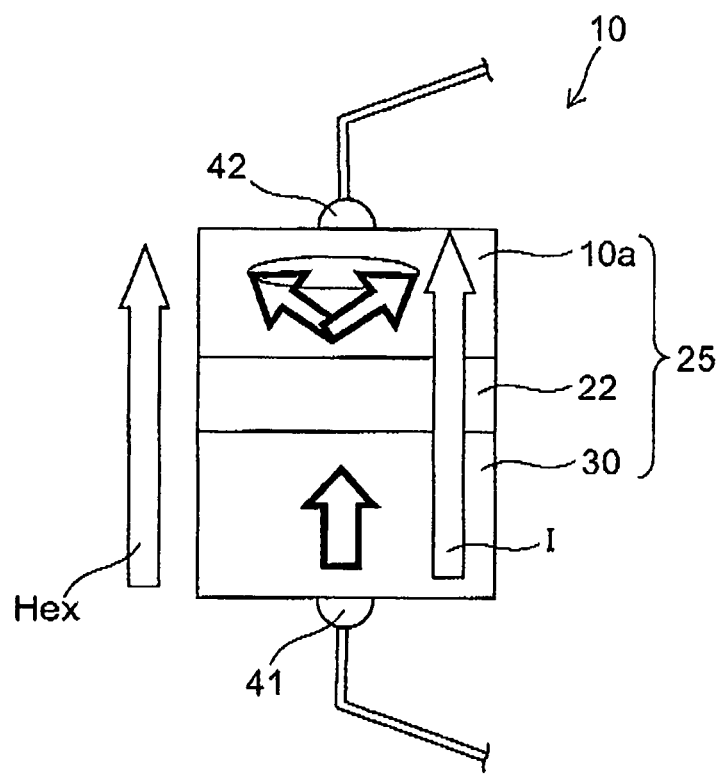
FIG. 1 is a schematic cross-sectional view illustrating the configuration of a spin torque oscillator according to a first embodiment of the invention.

FIG. 1 is a schematic sectional view illustrating the configuration of a spin torque oscillator according to a first embodiment of the invention.

As shown in FIG. 1, the spin torque oscillator 10 according to the first embodiment of the invention has a stacked structure 25 having, an oscillation layer (first magnetic body layer) 10a, a spin injection layer (second magnetic body layer) 30, and an intermediate layer 22 provided between the oscillation layer 10a and the spin injection layer 30.

And, the spin torque oscillator 10 can have one pair of electrodes, namely, a first electrode 41 and a second electrode 42 that can be conducted in the stacked direction of the stacked structure 25. That is, by the first electrode 41 and the second electrode 42, the driving current I is conducted to the stacked structure 25.

However, at least any one of the first and second electrodes 41 and 42 may be used together with, for example, main magnetic pole and return path (shield) and so forth of, for example, the magnetic recording head to be described later. In this case, at least any one of the above first and second electrodes 41, 42 of the spin torque oscillator 10 can be omitted. Hereinafter, the case that the spin torque oscillator 10 has the first and second electrodes 41, 42 will be described.

As shown in FIG. 1, the external magnetic field Hex is applied to the stacked structure 25.

In the spin torque oscillator 10 according to this embodiment, the oscillation layer 10a includes a Fe—Co—Al alloy. That is, the spin torque oscillator 10 according to this embodiment has, the first magnetic layer 10a including a layer containing spin Fe—Co—Al, the second magnetic layer 30, and the intermediate layer provided between the first magnetic layer 10a and the second magnetic layer 30. In the spin torque oscillator 10 according to this embodiment, the oscillation layer 10a (first magnetic layer 10a) may be made of one magnetic layer, and the magnetic layer may include a Fe—Co—Al alloy. The oscillation layer 10 (first magnetic layer 10a) may be composed of a plurality of layers, and at least one layer of the plurality of layers may include a Fe—Co—Al alloy. In this specification, "Fe—Co—Al alloy" is occasionally abbreviated as "FeCoAl alloy".

The spin torque oscillator 10 is formed on an appropriate substrate or on a ground, which is not shown, and is separated from the other circuits by insulator such as alumina or $SiO_2$, which is not shown.

For the first and second electrode 41, 42, a material such as Ti or Cu that has low electric resistance and is difficult to be oxidized can be used. Moreover, in the first electrode 41, it is desirable that the interface with the first magnetic layer 10a is set to be Cu. This is because by setting the interface to be Cu, the interface functions as a diffusion barrier layer of Al atoms constituting the first magnetic body layer 10a and the Al atoms can be prevented from diffusing to the first electrode 41.

In the spin torque oscillator 10 according to this embodiment, for the oscillation layer 10a, the Fe—Co—Al alloy having the following composition ratio is used. That is, the ratio of Fe and Co (Fe:Co) is 50 atom % (atomic percent):50 atom %, and the ratio of the mixture of the Fe and Co and Al (FeCo:Al) is 68 atom %:32 atom %. Hereinafter, the ratios are referred to as "$(Fe_{50at\%}Co_{50at\%})_{68at\%}Al_{32at\%}$)". Saturation magnetization Ms of this material is 660 emu/cc. The layer thickness of the oscillation layer 10a is 12 nm.

And, for the intermediate layer 22, Cu having a layer thickness of 3 nm is used.

On the other hand, for the spin injection layer 30, an alloy of Co and Pt whose ratio (Co:Pt) is 80 atom %: 20 atom % ($Co_{80at\%}Pt_{20at\%}$ alloy) having a layer thickness of 20 nm is used. The $Co_{80at\%}Pt_{20at\%}$ alloy has perpendicular anisotropy. The size of the element of the spin torque oscillator 10 is 70 nm×70 nm.

However, the spin torque oscillator 10 according to this embodiment may have not only the above materials and the layer thicknesses but also various materials and layer thicknesses.

For example, for the intermediate layer 22, for example, a material such as Cu, Au, or Ag having high spin transmittance can be used. It is desirable that the layer thickness of the intermediate layer 22 is one atom layer to 3 nm. Thereby, the exchange coupling of the oscillation layer 10a and the spin injection layer 30 can be regulated to be an appropriate value.

For the spin injection layer 30, a material having excellent perpendicular orientation such as, a CoCr-based magnetic layer such as CoCrPt or CoCrTa or CoCrTaPt or CoCrTaNb that is magnetized and oriented in the perpendicular direction to the film surface, a RE-TM-based amorphous alloy magnetic layer such as TbFeCo, a Co artificial lattice magnetic layer such as Co/Pd or Co/Pt or CoCrTa/Pd, a CoPt-based or FePt-based alloy magnetic layer, or a SmCo-based alloy magnetic layer can be appropriately used. Or, a soft magnetic layer that has a relatively large saturation magnetic flux density and has magnetic anisotropy in the longitudinal direction of the film surface such as CoFe or CoNiFe or NiFe or CoZrNb or FeN or FeSi or FeAlSi, or a Heusler alloy selected from the group of CoFeSi and CoMnSi and CoMnAl and so forth, or a CoCr-based magnetic alloy film in which the magnetization is oriented to the longitudinal direction of the film surface can be appropriately used. Furthermore, a layer in which a plurality of the above materials are stacked may be used.

For the oscillation layer 10a, a layer in which the FeCoAl alloy and various materials that can be used for the above spin injection layer 30 are stacked may be used.

For the oscillation layer 10a, a material in which at least any one or more of Si, Ge, Mn, Cr, B is further added to the FeCoAl alloy. Furthermore, for the oscillation layer 10a, a FeCoSi, FeCoGe, FeCoMn, FeCoCr, or FeCoB alloy in which any one or more of Si, Ge, Mn, Cr, B is used instead of Al in the FeCoAl alloy may be used. Thereby, for example, saturation magnetic flux density (Bs), anisotropic magnetic field (Hk), and spin torque transmission efficiency of the oscillation layer 10a and the spin injection layer 30 can be adjusted.

As described above, in the spin torque oscillator 10 of this embodiment, the oscillation layer 10a includes a Fe—Co—(Al, Si, Ge, Mn, Cr, B) alloy. "Fe—Co—(Al, Si, Ge, Mn, Cr, B) alloy" is an alloy including Fe and Co and at least any one of Al, Si, Ge, Mn, Cr. and B.

It is desirable that the layer thickness of the oscillation layer 10a is 5 nm to 20 nm, and it is desirable that the layer thickness of the spin injection layer 30 is 2 nm to 60 nm. It is desirable that the size of the element of the spin torque oscillator 10 is 10 nm×10 nm to 100 nm×100 nm, and the shape of the element may be circular cylinder or hexagonal cylinder.

FIG. 2 shows a graph illustrating characteristics of the spin torque oscillator according to the first embodiment of the invention.

Figure 2A:
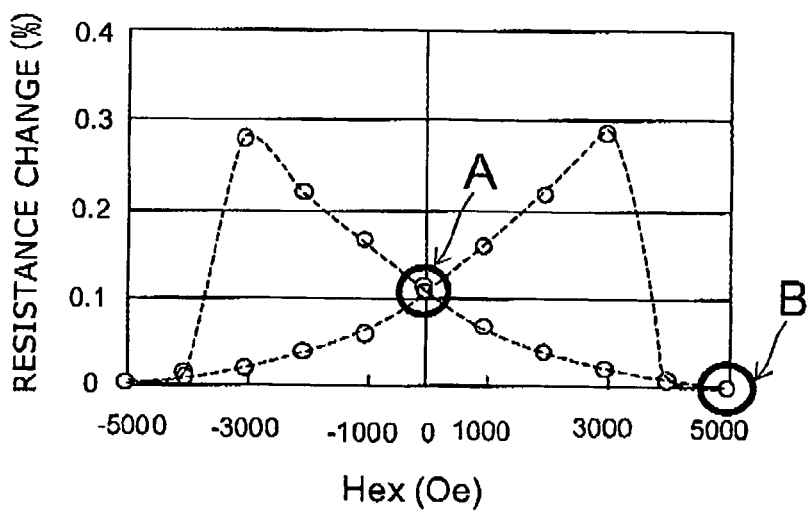
FIGS. 2A to 2E show graphs illustrating characteristics of the spin torque oscillator according to the first embodiment of the invention.
Figure 2B:
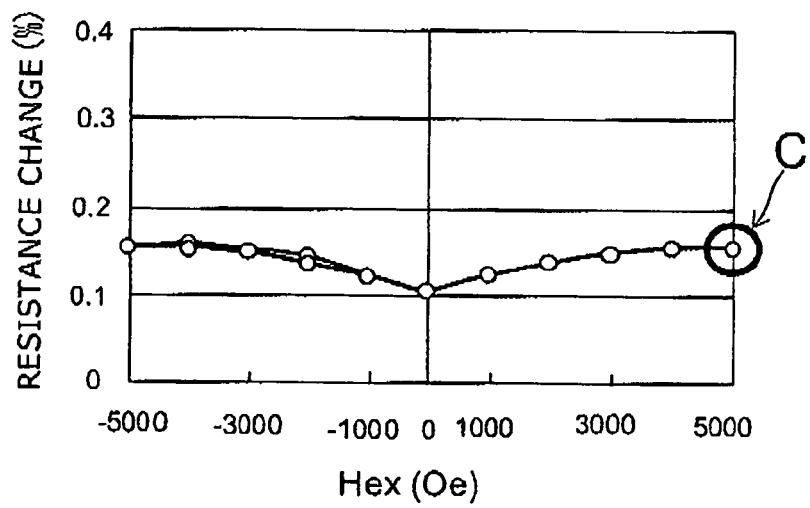

That is, FIG. 2A shows a RH curve in the case where the current density of the current flowing through the spin torque oscillator 10 is low, namely, when the current density J of the driving current I is $0.2 \times 10^8$ A/cm$^2$. FIG. 2B shows a RH curve in the case where the current density of the current flowing through the spin torque oscillator 10 is high, namely, when the current density J of the driving current I is $1.5 \times 10^8$ A/cm$^2$. In these figures, the horizontal axis represents an external magnetic field Hex applied to the spin torque oscillator 10, and the vertical axis represents resistance change during passing the current through the stacked structure 25 (change of the resistance between the first electrode 41 and the second electrode 42). In FIG. 2B, the values are displaced so that the value in Hex=0 becomes equal to the value of FIG. 2A.

Figure 2C:
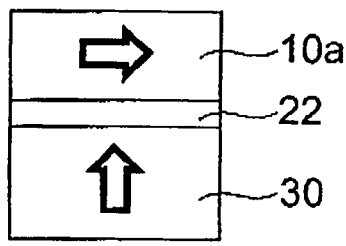
Figure 2D:
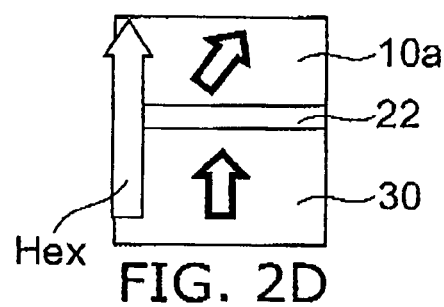
Figure 2E:
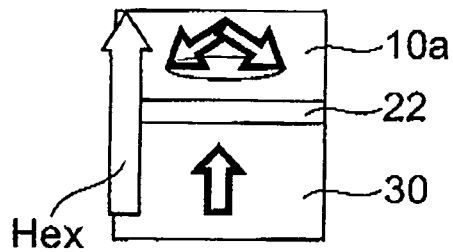

FIGS. 2C and 2D are schematic cross-sectional views showing the states of magnetization in the point A and the point B of FIG. 2A, respectively. FIG. 2E is a schematic cross-sectional view showing the state of magnetization in the point C of FIG. 2B.

As shown in FIG. 2A, in the low current density, the RH curve is a typical coercivity difference type and is not affected by the spin torque. That is, in the state of the point A in FIG. 2A, namely, when the external magnetic field is zero, by the shape anisotropy of the oscillation layer 10a, the direction of magnetization of the oscillation layer 10a is parallel to the layer surface as shown in FIG. 2C. And, in the state of the point B in FIG. 2A, namely, when the external magnetic field is large, the direction of magnetization of the oscillation layer 10a is approximately the same as the direction of the external magnetic field as shown in FIG. 2D.

On the other hand, as shown in FIG. 2B, if the current density J is large, the RH curve becomes a valley type. This indicates that the oscillation layer 10a oscillates. That is, in the state of the point C in FIG. 2B, namely, when the external magnetic field is large, as shown in FIG. 2E, the direction of magnetization of the oscillation layer 10a becomes reverse with respect to the external magnetic field by the spin torque and the magnetization is rotating. That is, by the spin torque by the driving current of the spin torque oscillator 10, the magnetization of the oscillation layer 10a is oscillating.

As described above, the spin torque oscillator 10 according to this embodiment does not oscillate, for example, when the current density J is $0.2 \times 10^8$ A/cm$^2$ but shows appropriate oscillation when the current density J is $1.5 \times 10^8$ A/cm$^2$.

First Comparative Example

Figure 3:
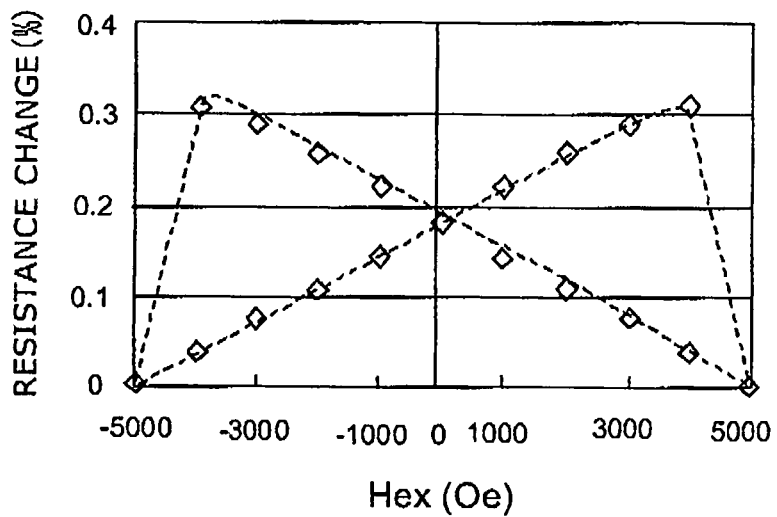
FIG. 3 shows a graph illustrating characteristics of a spin torque oscillator of a first comparative example.

FIG. 3 shows a graph, illustrating characteristics of a spin torque oscillator of a first comparative example.

In the spin torque oscillator of the first comparative example, as the oscillation layer 10a CoFe is used. Other than this, the spin torque oscillator is the same as the spin torque oscillator 10 according to this embodiment, the description thereof will be omitted. The saturation magnetization MS of CoFe is 1400 emu/cc, which is larger than 600 emu/cc of the FeCoAl alloy used for the oscillation layer 10a of the spin torque oscillator 10 according to this embodiment. FIG. 3 shows a result when the current density J of the driving current of the spin torque oscillator of the first comparative example is $1.5 \times 10^8$ A/cm$^2$.

As shown in FIG. 3, in the case of the spin torque oscillator of the first comparative example, although the current density J of the driving current I is $1.5 \times 10^8$ A/cm$^2$, which is relatively large, oscillation phenomenon is not shown. That is, the comparative example shows a RH curve analogous to the RH curve illustrated in FIG. 2 when the current density J is low (J is $0.2 \times 10^8$ A/cm$^2$) in the spin torque oscillator 10 according to this embodiment.

By simulation by micro-magnetics method, when, for example, CoFe is used for the oscillation layer 10a like the first comparative example, the current density J in which the RH curve is a valley type, namely, the current density J showing oscillation phenomenon, is $5.6 \times 10^8$ A/cm$^2$. As described above, in the spin torque oscillator of the first comparative example, for oscillation, such a very large current as $5.6 \times 10^8$ A/cm$^2$ is required. However, because this current is very large, heat generation by Joule heat is very large, the element characteristics become degraded, and therefore, practically, it is very difficult to pass the current. Therefore, when CoFe is applied to the oscillation layer 10a, it is difficult to oscillate stably.

By contrast, the spin torque oscillator 10 according to this embodiment exerts a characteristic of easily oscillating even in the low current density (for example, the current density J is $1.5 \times 10^8$ A/cm$^2$). That is, the spin torque oscillator 10 according to this embodiment can oscillate by the current density that is about a fourth part of the current density of the spin torque oscillator of the first comparative example.

As described above, according to the spin torque oscillator 10 according to this embodiment, the spin torque oscillator by which oscillation can be performed stably by the low current density and in which intensity of the longitudinal high-frequency magnetic field is high can be provided.

In the spin torque oscillator 10 according to this embodiment, a magnetic film with perpendicular anisotropy is used as the spin injection layer 30, and thereby, it can be thought that the conductive efficiency of the spin torque is improved.

That is, when a magnetic film with perpendicular anisotropy is used for the spin injection layer 30, the plane through which trace of the magnetization of the oscillation layer 10a passes is approximately perpendicular to the magnetization direction of the spin injection layer 30, and the angle made by the magnetization direction of the oscillation layer 10a and the magnetization direction of the spin injection layer 30 is always approximately perpendicular. Therefore, the spin torque transmission is constantly performed stably.

On the other hand, when the spin injection layer 30 is an longitudinally magnetized film, the plane through which trace of the magnetization of the oscillation layer 10a passes is approximately parallel to the magnetization direction of the spin injection layer 30. Therefore, the angle made by the magnetization direction of the oscillation layer 10a and the magnetization direction of the spin injection layer 30 fluctuates with each passing moment. As a result, at one moment, the spin torque transmission efficiency is high but at another moment the efficiency becomes small, the spin torque transmission efficiency drastically lowers by the time average.

Therefore, when the magnetic film with perpendicular anisotropy is used for the spin injection layer 30, the spin torque transmission efficiency is higher, and the oscillation can be performed stably with the low current density.

Therefore, in the spin torque oscillator 10 of this embodiment, it is desirable that the spin injection layer 30 includes a magnetic film with perpendicular anisotropy.

Figure 4A:
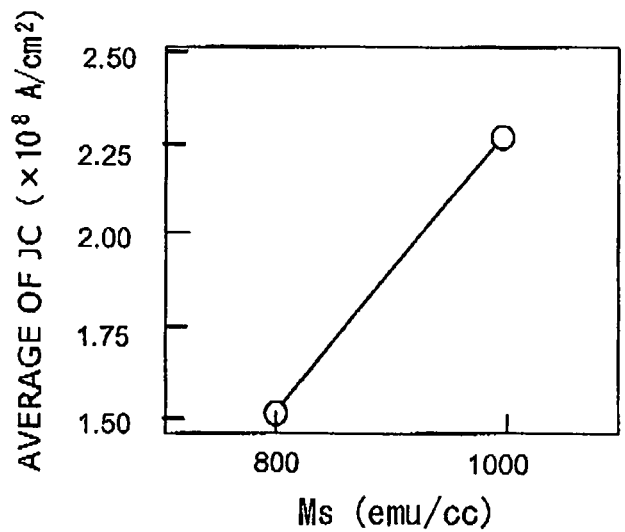
FIGS. 4A and 4B show graphs illustrating characteristics of the spin torque oscillator according to the first embodiment of the invention.
Figure 4B:
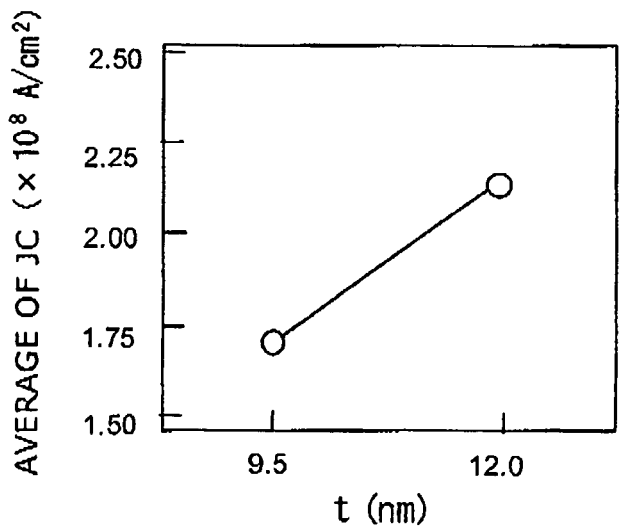

FIGS. 4A and 4B show graphs illustrating characteristics of the spin torque oscillator according to the first embodiment of the invention.

That is, FIGS. 4A and 4B show graphs illustrating experimental results of relations between the critical current density Jc when the opening angle of rotation of the magnetization of the oscillation layer 10a becomes 180°, and the saturation magnetization Ms and the layer thickness t of the oscillation layer 10a. The horizontal axis of FIG. 4A represents the saturation magnetization Ms of the oscillation layer 10a, and the horizontal axis of FIG. 4B represents the layer thickness t of the oscillation layer 10a. And, the vertical axis of FIGS. 4A and 4B is absolute value of average Jc of the critical current density Jc when the opening angle of rotation of the magnetization becomes 180° uniformly in all of the regions of the layer thickness direction of the oscillation layer 10a.

As shown in FIGS. 4A and 4B, the dependency of the critical current density Jc on the saturation magnetization Ms is larger than the dependency thereof on the layer thickness t. That is, the inclination of the critical current density Jc with respect to the saturation magnetization Ms is about twice as much as the inclination of the critical current density Jc with respect to the layer thickness t. That is, the critical current density Jc is proportional to the layer thickness t of the oscillation layer 10a and proportional to the square of the saturation magnetization Ms. That is, the critical current density Jc is proportional to $tMs^2$.

In the spin torque oscillator 10, by the magnetic charge amount generated in an air bearing surface of the oscillation layer 10a, the high-frequency magnetic field Hac is produced, Therefore, when the oscillation layer 10a rotates uniformly by a large angle (when the opening angle of rotation of the magnetization becomes 180°), it is thought that the intensity Hac of the high-frequency magnetic field is proportional to a product (tMs) of the layer thickness t and the saturation magnetization Ms of the oscillation layer 10a.

As a result, when the saturation magnetization Ms of the oscillation layer 10a is small, unless the layer thickness t is set to be thick, the intensity Hac of the high-frequency magnetic field with the high intensity required for the high-frequency magnetic field assist recording cannot be obtained.

Therefore, in the oscillation layer 10a according to this embodiment, it is necessary that reduction of the critical current density Jc is achieved by using a material of low saturation magnetization Ms of the oscillation layer 10a, and that increase of the intensity Hac of the high-frequency magnetic field is achieved by enlarging the layer thickness t of the oscillation layer 10a in the practically possible range.

Figure 5:
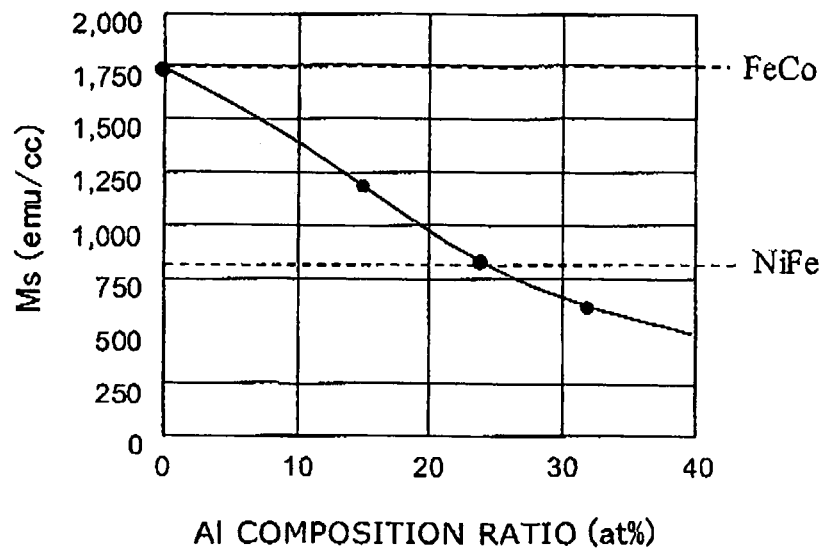
FIG. 5 shows a graph illustrating characteristics of a FeCoAl alloy used for the spin torque oscillator according to the first embodiment of the invention.

FIG. 5 shows a graph illustrating characteristics of a FeCoAl alloy used for the spin torque oscillator according to the first embodiment of the invention.

That is, FIG. 5 illustrates the relation of Al composition ratio to the saturation magnetization Ms in the FeCoAl alloy that can be used in the first embodiment. In FIG. 5, the horizontal axis represents the Al composition ratio in the FeCoAl alloy, and the vertical axis represents the saturation magnetization Ms.

In FIG. 5, the value of the saturation magnetization of FeCo and the value of saturation magnetization of NiFe, which are comparative examples, are shown by dashed lines.

As shown in FIG. 5, in the FeCoAl alloy, by increase of the Al composition ratio, the saturation magnetization Ms decreases, and becomes the value of the saturation magnetization of NiFe or less when the Al composition ratio is 24 atom % or more.

Because the spin torque is transferred at the interface of the intermediate layer 22 and the oscillation layer 10a, if the layer thickness t of the oscillation layer 10a is excessively thick, large rotation in which the opening angle of the rotation of magnetization becomes 180° is shown in the vicinity of the interface, but such large rotation cannot be performed in the region separate from the interface. Therefore, it can be caused that even when the layer thickness t is set to be thicker, the intensity Hac of the high-frequency magnetic field does not largely increase.

Therefore, for performing rotation uniformly by large angle in the all of the regions of the layer thickness direction of the oscillation layer 10a (the opening angle of rotation of the magnetization becomes 180°), it is necessary that the layer thickness t of the oscillation layer 10a is set to be 30 nm or less.

Therefore, when a material having the low saturation magnetization Ms is used for the oscillation layer 10a, it is necessary that the saturation magnetization Ms of the material is set to be 500 emu or more for setting the intensity Hac of the required high-frequency magnetic field to be the required intensity. Therefore, from the experimental result of the Al composition ratio dependency of the saturation magnetization Ms illustrated in FIG. 5, it is desirable that the Al composition ratio is set to be 40 atom % or less.

On the other hand, it is the most suitable that the saturation magnetization Ms of the oscillation layer 10a is 700 emu/cc to 1000 emu/cc. In this case, the layer thickness t of the oscillation layer 10a becomes 10 nm to 25 nm, and in all of the regions of the layer thickness direction of the oscillation layer 10a, rotation can be performed by large angle (the opening angle of rotation of the magnetization becomes 180°). That is, in this case, the intensity Hac of the high-frequency magnetic field can be most efficiently set to be large.

Therefore, It is more desirable that the Al composition ratio is 20 atom % to 30 atom %.

On the other hand, as described for FIGS. 4A and 4B previously, when the saturation magnetization Ms of the oscillation layer 10a increases, the critical current density Jc (driving current I) increases proportionally to the square of Ms. Furthermore, heat generation by Joule heat of the element of the spin torque oscillator 10 increases proportionally to the square of the driving current I. Therefore, heat generation of the Joule heat of the element comes to increase proportionally to the biquadrate of the saturation magnetization Ms. In this case, when the saturation magnetization Ms is larger than 1300 emu/cc, the element characteristics are degraded by the heat generation of the element, and therefore, utilization of the element is difficult.

Therefore, it is desirable that the saturation magnetization Ms of the oscillation layer 10a is set to be 1300 emu/cc or less. Therefore, from the experimental result of the dependency of the saturation magnetization Ms on the Al composition ratio illustrated in FIG. 5, it is desirable that the Al composition ratio is set to be 12 atom % or more.

It is thought that the principle of the spin torque effect in the spin torque oscillator and the principle of the CPP-GMR (Current Perpendicular to Plane—Giant Magneto-Resistive) effect are generated by the same origin. That is, in the stacked structure composed of the two magnetic layers magnetized to anti-parallel states and the intermediate layer provided therebetween, the phenomenon that conductive electrons spin-polarized to the magnetization direction of the first magnetic layer flow into the other magnetic layer through the intermediate layer will be thought. In this case, when flowing into the other magnetic layer, the conductive electrons spin-polarized to the magnetization direction of the first magnetic layer are spin-scattered and transfer the spin angular momentum as the spin torque concurrently with the resistance increase. Therefore, increase of the MR ratio is directly connected to increase of the spin torque transmission efficiency.

Therefore, it is desirable to use a material having large GMR effect for the interface between the oscillation layer and the spin injection layer. Therefore, it is desirable that the composition of FeCo in the FeCo—(Al, Si, Ge, Mn, Cr, B) alloy used for the oscillation layer 10a of the spin torque oscillator 10 according to this embodiment is the composition in which the crystal structure becomes bcc structure, namely, Fe composition is 20 atom % or more.

As described above, in the spin torque oscillator 10 according to this embodiment, by setting the Al composition ration to be 10 atom % to 40 atom % in the FeCoAl alloy used for the oscillation layer 10a, the spin torque oscillation element in which good intensity of the high-frequency magnetic field can be achieved and the oscillation can be performed by the low driving current can be fabricated.

In patent document 5, the FeCoAl alloy is utilized for the free layer. However, the technique disclosed in Patent document 5 is longitudinal magnetization type memory application utilizing TMR, and is different from the invention whose object is application to the spin torque oscillator utilizing GMR. In Patent document 6, it is assumed to utilize a Heusler alloy, and the composition is limited to $Co_2FeAl$ and the composition of FeCo is largely different from that of the spin torque oscillator 10 according to this embodiment. In Non-patent document 3, reduction of Jc by FeCoAl in the longitudinally magnetized film CPP-GMR head application is described, but this effect can be explained by $Jc \propto tMs^2$. In the spin torque oscillator 10 according to this embodiment, the magnetic film with perpendicular anisotropy is used in the spin torque oscillation element, and by the newly found effect that cannot be explained by $Jc \propto tMs^2$, reduction of Jc can be performed.

Second Embodiment

Figure 6:
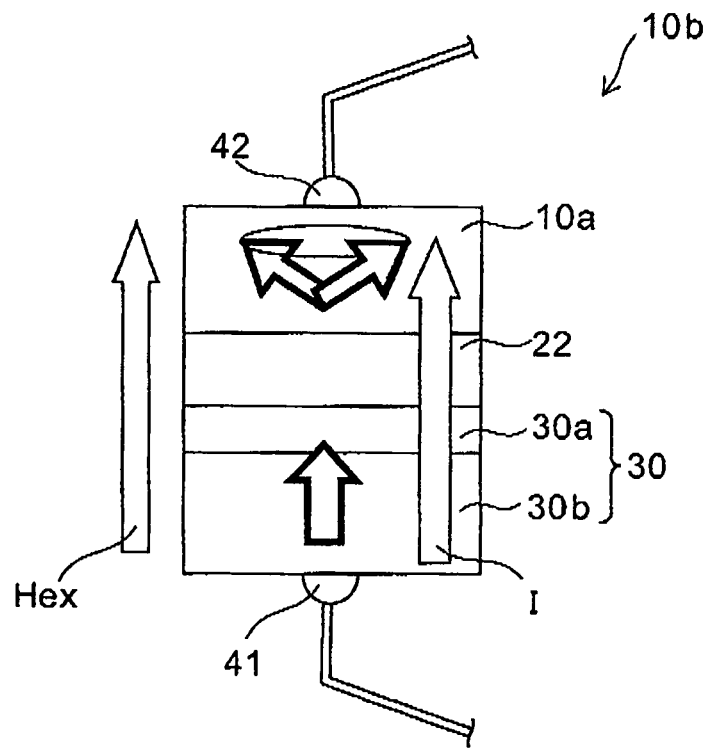
FIG. 6 is a schematic cross-sectional view illustrating the configuration of a spin torque oscillator according to a second embodiment of the invention.

FIG. 6 is a schematic cross-sectional view illustrating the configuration of the spin torque oscillator according to a second embodiment of the invention.

As shown in FIG. 6, in the spin torque oscillator 10b according to the second embodiment of the invention, as the spin injection layer 30, a stacked film of a $(Fe_{50at\%}Co_{50at\%})_{76at\%}Al_{24at\%}$ alloy (first spin injection layer 30a) with a layer thickness of 2 nm and a CoPt layer (second spin injection layer 30b) 30b with a layer thickness of 20 nm is used. The first spin injection layer 30a that is a FeCoAl layer is provided at the interface with the intermediate layer 22, namely, on the side of the oscillation layer 10a. In the oscillation layer 10a, a $(Fe_{50at\%}Co_{50at\%})_{84at\%}Al_{16at\%}$ alloy with a layer thickness of 12 nm is used.

Other than this, the spin torque oscillator 10b is the same as the spin torque oscillator 10 according to the first embodiment. That is, in the intermediate layer 22, Cu with a layer thickness of 3 nm is used. The size of the element of the spin torque oscillator 10 is 70 nm×70 nm.

The spin torque oscillator 10b according to this embodiment having such a configuration suitably oscillates in the state that the external magnetic field of 6 kOe is applied thereto when the current density J is $1.4 \times 10^8$ A/cm$^2$. That is, the oscillation layer 10a of the spin torque oscillator 10b shows large rotation in which the opening angle of the rotation of the magnetization becomes 180°.

Figure 7:
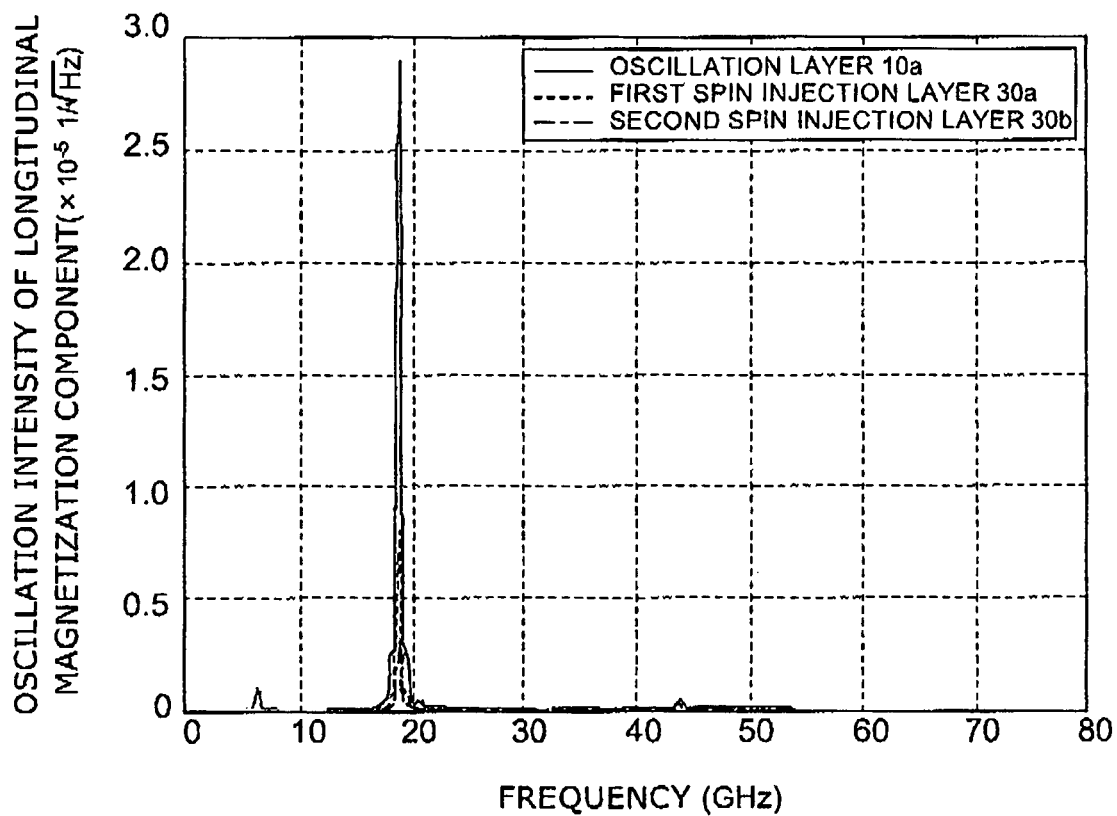
FIG. 7 shows a graph illustrating characteristics of the spin torque oscillator according to the second embodiment of the invention.

FIG. 7 shows a graph illustrating characteristics of the spin torque oscillator according to the second embodiment of the invention.

That is, FIG. 7 illustrates oscillation spectrum of longitudinal magnetization component of each of the magnetic layers in the spin torque oscillator 10b according to the second embodiment of the invention. The horizontal axis of FIG. 7 represents oscillation frequency, and the vertical axis represents oscillation intensity of the longitudinal magnetization component.

As shown in FIG. 7, the spin torque oscillator 10b according to this embodiment has a sharp peal at 19 GHz. From this, it can be found that the oscillation layer 10a oscillates very stably.

As described above, by providing the first spin injection layer 30a made of a FeCoAl alloy in the oscillation layer 10a and at the interface of the spin injection layer 30 with the intermediate layer, the spin torque transmission efficiency is further improved. That is, as compared to a conventional oscillation layer using CoFe/NiFe or a spin injection layer using CoPt, the spin torque transmission efficiency can be more improved.

Thereby, according to the spin torque oscillator 10b according to this embodiment, the spin torque oscillator by which oscillation can be performed stably by the low current density and in which the intensity of the longitudinal high-frequency magnetic field is high can be provided.

By the way, when the first spin injection layer 30a made of a FeCoAl alloy is provided at the interface between the spin injection layer 30 and the intermediate layer, it is feared whether the FeCoAl alloy that is the longitudinally magnetized film is perpendicularly magnetized, but because the FeCoAl alloy has the low Ms and the layer thickness of the first spin injection layer 30a is set to be 2 nm, which is thin, and the exchange coupling force between the FeCoAl layer of the first spin injection layer 30a and the CoPt alloy layer of the second spin injection layer 30b is sufficiently large, it can be realized that the FeCoAl alloy that is the longitudinal magnetized film is perpendicularly magnetized. It is desirable that the layer thickness of the first spin injection layer 30a is 5 nm or less, and in this case, by adjusting the anisotropic energy of the second spin injection layer 30b and the exchange coupling force between the first spin injection layer 30a and the second spin injection layer 30b, the first spin injection layer 30a can be perpendicularly magnetized.

When the first spin injection layer 30a made of a FeCoAl alloy is provided at the interface of the spin injection layer 30 with the intermediate layer, it is feared whether the spin torque transmission efficiency can be sufficiently large. Because the spin diffusion length of the FeCoAl alloy is short, even when the FeCoAl alloy of the first spin injection layer 30a is thin, the conductive electrons are spin-polarized. As a result, even when the FeCoAl alloy of the first spin injection layer 30a is thin, the spin torque transmission efficiency can be sufficiently large. Therefore, the layer thickness of the first spin injection layer 30a only needs to be 0.5 nm or more.

As described above, it is desirable that the layer thickness of the FeCoAl alloy of the first spin injection layer 30a is 0.5 nm to 5 nm.

However, the spin torque oscillator 10b according to this embodiment can also have various materials and layer thicknesses as well as the above material and the layer thickness.

For example, for the intermediate layer 22, for example, a material such as Cu. Au, or Ag having high spin transmittance can be used. It is desirable that the layer thickness of the intermediate layer 22 is one atom layer to 3 nm. Thereby, the exchange coupling between the oscillation layer 10a and the spin injection layer 30 can be regulated to be an appropriate value.

For the second spin injection layer 30b of the spin injection layer 30, a material having excellent perpendicular orientation such as, a CoCr-based magnetic layer such as CoCrPt or CoCrTa or CoCrTaPt or CoCrTaNb that is magnetized and oriented to the perpendicular direction to the film surface, a RE-TM-based amorphous alloy magnetic layer such as TbFeCo, a Co artificial lattice magnetic layer such as Co/Pd or Co/Pt or CoCrTa/Pd, a CoPt-based or FePt-based alloy magnetic layer, or a SmCo-based alloy magnetic layer can be appropriately used. Or, a soft magnetic layer that has a relatively large saturation magnetic flux density and has magnetic anisotropy in the longitudinal direction of the film surface such as CoFe or CoNIFe or NiFe or CoZrNb or FeN or FeSi or FeAlSi, or a Heusler alloy selected from the group of CoFeSi and CoMnSi and CoMnAl and so forth, or a CoCr-based magnetic alloy film in which the magnetization is oriented in the longitudinal direction of the film surface can be appropriately used. Furthermore, a layer in which a plurality of the above materials are stacked may be used.

For the oscillation layer 10a, a layer in which the FeCoAl alloy and various materials that can be used for the second spin injection layer 30b of the above spin injection layer 30 are stacked may be used.

For the oscillation layer 10a and the first spin injection layer 30a, a material in which at least any one or more of Si, Ge, Mn, Cr, B is further added to the FeCoAl alloy may be used. Furthermore, for the oscillation layer 10a, a FeCoSi, FeCoGe, FeCoMn, FeCoCr, or FeCoB alloy in which any one or more of Si, Ge, Mn, Cr, B is used instead of Al in the FeCoAl alloy may be used. Thereby, for example, saturation magnetic flux density (Bs), anisotropic magnetic field (Hk), and spin torque transmission efficiency of the oscillation layer 10a and the spin injection layer 30 can be adjusted.

That is, in the spin torque oscillator 10b according to this embodiment, the oscillation layer 10a includes a Fe—Co—(Al, Si, Ge, Mn, Cr, B) alloy, and the portion of the side of the intermediate layer 22 of the spin injection layer 30 includes the Fe—Co—(Al, Si, Ge, Mn, Cr, B) alloy.

It is desirable that the layer thickness of the oscillation layer 10a is 5 nm to 20 nm, and it is desirable that the layer thickness of the spin injection layer 30 is 2 nm to 60 nm. Si has a characteristic of being difficult to diffuse from the FeCo alloy parent phase in annealing. Therefore, in the case of requiring anneal in the element process or in the case of using the material for the first spin injection layer 30a, it is desirable to use a FeCoSi alloy.

Third Embodiment

Figure 8:
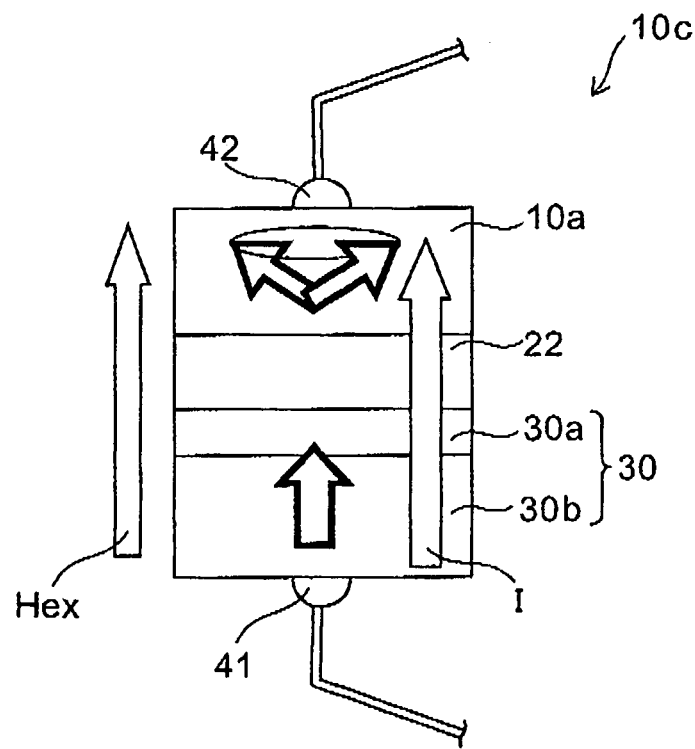
FIG. 8 is a schematic cross-sectional view illustrating the configuration of a spin torque oscillator according to a third embodiment of the invention.

FIG. 8 is a schematic cross-sectional view illustrating the configuration of the spin torque oscillator according to a third embodiment of the invention.

As shown in FIG. 8, in the spin torque oscillator 10c according to the third embodiment of the invention, as the spin injection layer 30, a stacked film of the FeCoAl layer of the intermediate layer side (first spin injection layer 30a) and the CoPt layer (second spin injection layer 30b) 30b with a layer thickness of 20 nm is used. In the spin torque oscillator according to this embodiment, the oscillation layer 10a does not include a FeCoAl alloy.

That is, the spin injection layer 30 is composed of a stacked structure of the FeCoAl alloy layer and the CoPt alloy layer that is magnetized and oriented in the perpendicular direction to the film surface, and at the interface with the intermediate layer 22, the FeCoAl alloy layer is disposed. That is, the spin injection layer 30 has a second spin injection layer 30b including the CoPt alloy that is magnetized and oriented in the longitudinal direction to the film surface and a first spin injection layer 30a that is disposed between the second spin injection layer 30b and the intermediate layer 22 and that includes the FeCoAl alloy.

It is desirable that the layer thickness of the FeCoAl alloy layer to be the first spin injection layer 30a is 0.5 nm to 5 nm.

On the other hand, it is desirable that the layer thickness of the CoPt alloy serving as the second spin injection layer 30b is 2 nm to 60 nm.

The layer thickness of the first spin injection layer 30a and the layer thickness of the second spin injection layer 30b can be appropriately adjusted so that the spin torque is sufficiently transferred to the oscillation layer by the FeCoAl alloy serving as the first spin injection layer 30a and so that the FeCoAl alloy layer is perpendicularly magnetized by the vertical magnetic anisotropy of the CoPt alloy serving as the second spin injection layer 30b.

The FeCoAl alloy used for the first spin injection layer 30a can also include any one or more of Si, Ge, Mn, Cr, and B.

Furthermore, a FeCoSi, FeCoGe, FeCoMn, FeCoCr, or FeCoB alloy in which any one or more of Si, Ge, Mn, Cr, B is used instead of Al in FeCoAl alloy used for the first spin injection layer 30a may be used for the first spin injection layer 30a.

That is, in the spin torque oscillator 10c according to this embodiment, at the interface of the spin injection layer 30 with the intermediate layer 22 includes a Fe—Co—(Al, Si, Ge, Mn, Cr, B) alloy.

On the other hand, for the oscillation layer 10a, a high Bs soft magnetic material (FeCo/NiFe stacked film) generating magnetic field in oscillation can be used, and it is desirable that the layer thickness of the oscillation layer 10a is 5 nm to 20 nm.

For the second spin injection layer 30b and the oscillation layer 10a, a soft magnetic layer that has a relatively large saturation magnetic flux density and has magnetic anisotropy in the longitudinal direction of the film surface such as CoFe or CoNiFe or NiFe or CoZrNb or FeN or FeSi or FeAlSi, or a Heusler alloy selected from the group of CoFeSi and CoMnSi and CoMnAl and so forth, or a CoCr-based magnetic alloy film in which the magnetization is oriented in the longitudinal direction of the film surface can be used. Furthermore, a material having excellent perpendicular orientation such as, a CoCr-based magnetic layer such as CoCrPt or CoCrTa or CoCrTaPt or CoCrTaNb that is magnetized and oriented in the perpendicular direction to the film surface, a RE-TM-based amorphous alloy magnetic layer such as TbFeCo, a Co artificial lattice magnetic layer such as Co/Pd or Co/Pt or CoCrTa/Pd, a CoPt-based or FePt-based alloy magnetic layer, or a SmCo-based alloy magnetic layer can be appropriately used.

In the second spin injection layer 30b and the oscillation layer 10a, a plurality of the above materials may be stacked. Thereby, saturation magnetic flux density (Bs), anisotropic magnetic field (Hk) of the oscillation layer 10a and the spin injection layer 30 can be adjusted.

As the first and second electrodes 41, 42, a material such as Ti or Cu having low electric resistance and being difficult to be oxidized can be used.

For the intermediate layer 22, a material such as Cu, Au, or Ag having high spin transmittance can be used. It is desirable that the layer thickness of the intermediate layer 22 is one atom layer to 3 nm. Thereby, the exchange coupling between the oscillation layer 10a and the spin injection layer 30 can be regulated to be an appropriate value.

In the spin torque oscillator 10c according to this embodiment having such a configuration, by providing the first spin injection layer 30a made of a FeCoAl alloy at the interface of the spin injection layer 30 with the intermediate layer, the spin torque transmission efficiency is improved.

Thereby, according to the spin torque oscillator 10c according to this embodiment, the spin torque oscillator by which oscillation can be performed stably by the low current density and in which the intensity of the longitudinal high-frequency magnetic field is high can be provided.

By the way, when the first spin injection layer 30a made of a FeCoAl alloy is provided at the interface of the spin injection layer 30 on the intermediate layer side, because the FeCoAl alloy has the low Ms and the layer thickness of the first spin injection layer 30a is set to be 2 nm, which is thin, and the exchange coupling force between the FeCoAl layer of the first spin injection layer 30a and the CoPt alloy layer of the second spin injection layer 30b is sufficiently large, it can be realized that the FeCoAl alloy that is the longitudinally magnetized film is perpendicularly magnetized. Because the spin diffusion length of FeCoAl alloy is short, the spin torque transmission efficiency can be sufficiently large.

Fourth Embodiment

A magnetic recording head according to a fourth embodiment of the invention will be described with assuming the case of performing recording on a perpendicular magnetic recording medium of multiparticle.

Figure 9:
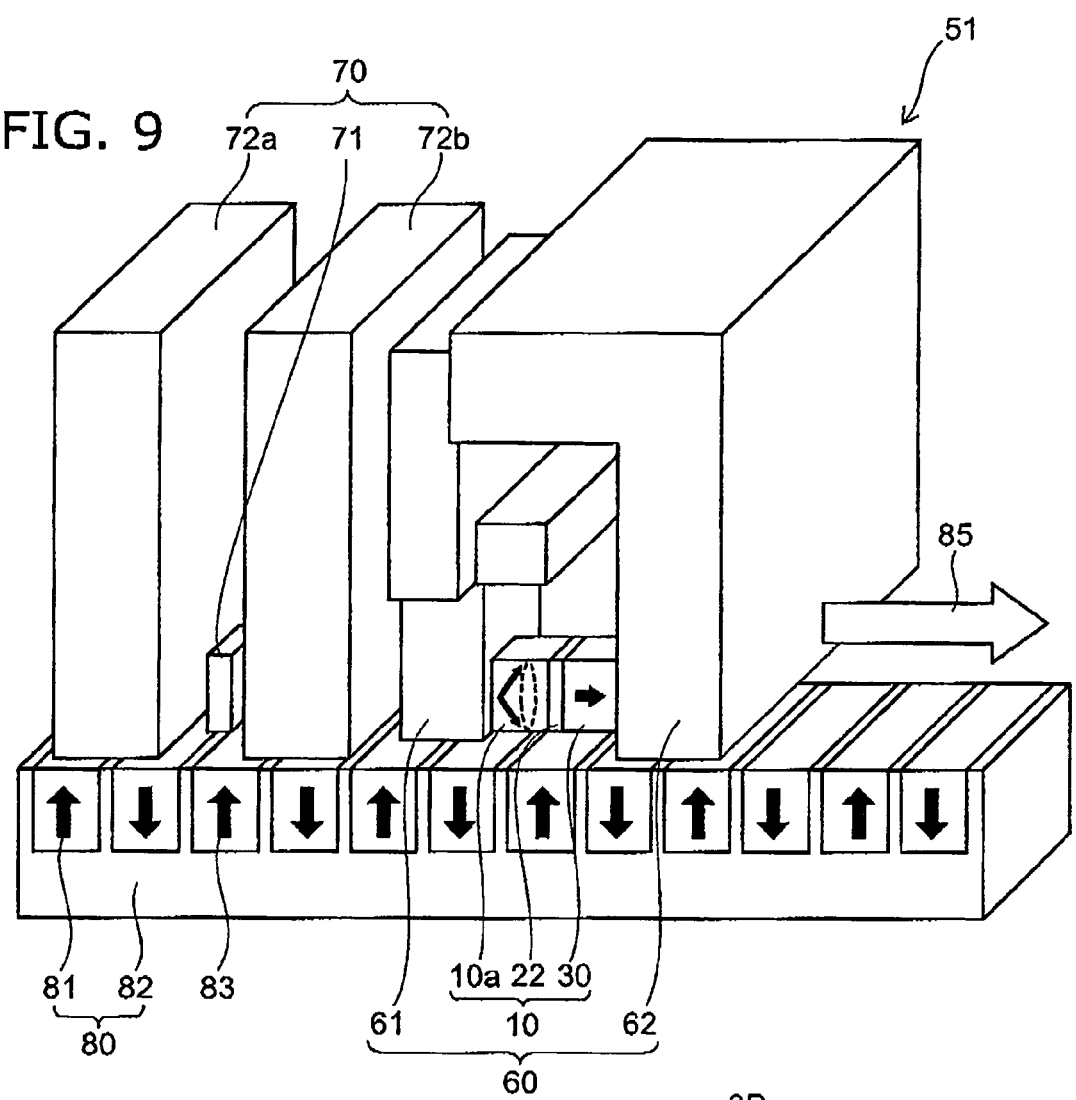
FIG. 9 is a schematic perspective view illustrating the configuration of a magnetic recording head according to a fourth embodiment of the invention.

FIG. 9 is a schematic perspective view illustrating the configuration of the magnetic recording head according to the fourth embodiment of the invention.

Figure 10:
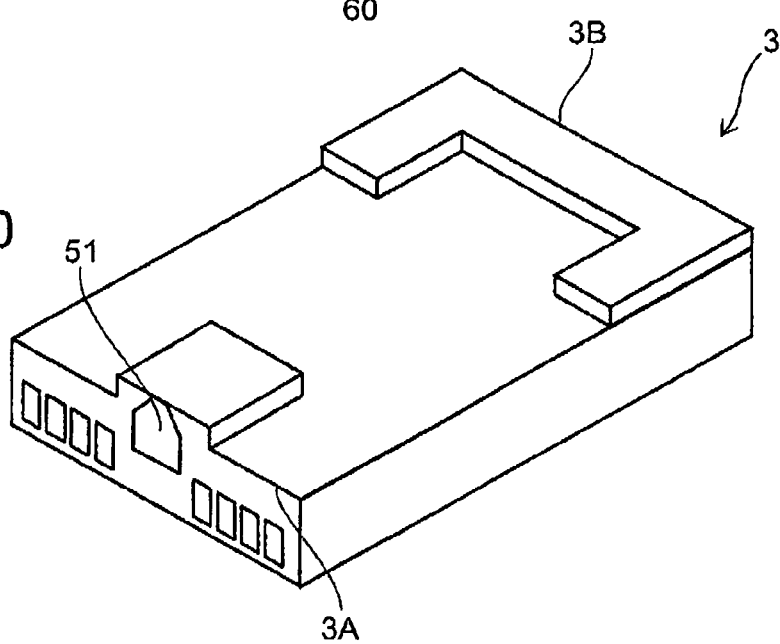
FIG. 10 is a schematic perspective view Illustrating the configuration of a head slider on which the magnetic recording head according to the fourth embodiment of the invention is mounted.

FIG. 10 is a schematic perspective view illustrating the configuration of a head slider on which the magnetic recording head according to the fourth embodiment of the invention is mounted.

Figure 11:
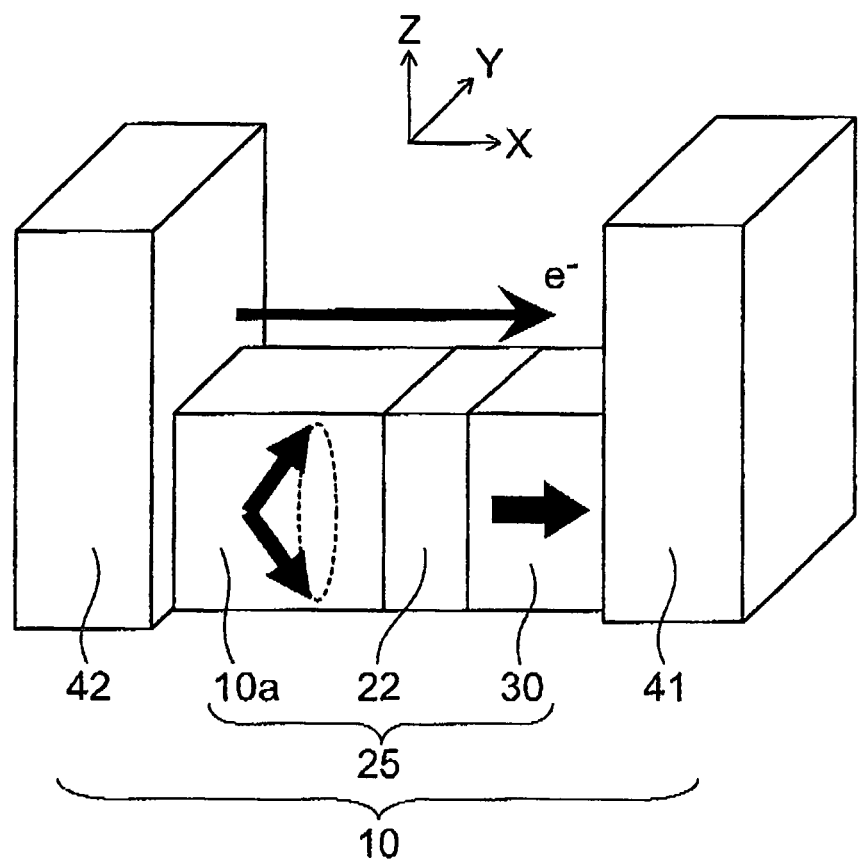
FIG. 11 is a schematic perspective view illustrating the configuration of a spin torque oscillator used for the magnetic recording head according to the fourth embodiment of the invention.

FIG. 11 is a schematic perspective view illustrating the configuration of the spin torque oscillator used for the magnetic recording head according to the fourth embodiment of the invention.

As shown in FIG. 9, the magnetic recording head 51 according to the fourth embodiment of the invention has a main magnetic pole 61 and the above spin torque oscillator 10 according to the embodiment of the invention.

In this specific example, as the spin torque oscillator, the spin torque oscillator 10 according to the first embodiment is used, but the invention is not limited thereto, and the spin torque oscillators 10b; 10c according to the second and third embodiments and various spin torque oscillators modified thereof can be used. In the specific example to be described as follows, the example in which the spin torque oscillator 10 according to the first embodiment is used as the spin torque oscillator will be described.

As shown in FIG. 9, the oscillation layer 10a can be disposed between the main magnetic pole 61 and the spin injection layer 30. However, conversely, the spin injection layer 30 may be disposed between the main magnetic pole 61 and the oscillation layer 10a.

The above main magnetic pole 61 and the spin torque oscillator 10 are included in the wiring head section 60.

Furthermore, the writing head section 60 can further include a return path (shield) 62.

The main magnetic pole 61 and the second electrode 42 are shared, and the return path (shield) 62 and the first electrode 41 are shared.

As shown in FIG. 9, in the magnetic recording head 51 according to this embodiment, further a reproducing head section 70 can be provided.

The reproducing head section 70 includes a first magnetic shield layer 72a, a second magnetic shield layer 72b, and a magnetic reproducing element 71 provided between the first magnetic shield layer 72a and the second magnetic shield layer 72b.

Components of the above reproducing head section 70 and components of the above writing head section 60 are separated by insulator such as alumina, which is not shown.

As the magnetic reproducing element 71, GMR element or TMR (Tunnel Magneto-Resistive effect) element or the like can be utilized. For enhancing the reproducing resolution, the magnetic reproducing element 71 is disposed between the two magnetic shield layers, namely, the first and second magnetic shield layers 72a, 72b.

And, as shown in FIG. 9, a magnetic recording medium 80 is disposed opposed to an air bearing surface 61s of the magnetic recording head 51. And, the main magnetic pole 61 applies recording magnetic field to the magnetic recording medium 80. The air bearing surface 61s of the magnetic recording head 51 can be the main surface of the main magnetic pole 61 opposed to the magnetic recording medium 80 disposed to the magnetic recording head 51.

For example, as shown in FIG. 10, the magnetic recording head 51 is mounted on the head slider 3. The head slider 3 is made of $Al_2O_3$/TiC or the like, and designed and fabricated so as to be capable of relatively moving with floating or contacting on the magnetic recording medium 80 such as a magnetic disk.

The head slider 3 has an air inflow side 3A and an air outflow side 3B, and the magnetic recording head 51 is disposed on a side surface or the like of the air outflow side 3B. Thereby, the magnetic recording head 51 mounted on the head slider 3 relatively moves with floating or contacting on the magnetic recording medium 80.

As shown in FIG. 9, the magnetic recording medium 80 has a medium substrate 82 and magnetic recording layers 81 provided thereon. By the magnetic field applied from the writing head section 60, magnetization 83 of the magnetic recording layer 81 is controlled to a predetermined direction, and thereby, writing is performed. In this case, the magnetic recording medium 80 relatively moves in the direction of the medium moving direction 85 with respect to the magnetic recording head 51.

On the other hand, the reproducing head section 70 reads the direction of the magnetization of the magnetic recording layer 81.

As shown in FIG. 11, the spin torque oscillator 10 used in this embodiment has the stacked structure 25 in which the spin injection layer 30, the intermediate layer 22 having high spin transmittance, and the oscillation layer 10a are stacked in this order, and by passing a driving electron flow through the first electrode 41 and the second electrode 42 connected to the stacked structure 25, high-frequency magnetic field can be generated from the oscillation layer 10a. The driving current density is appropriately adjusted so as to be in a desired oscillation state. If the recording track pitch is reduced and the element size of the spin torque oscillator is smaller, release of heat is improved, and therefore, the driving current density can be more improved.

It is desirable that the coercitivity of the spin injection layer 30 is set to be smaller than the magnetic field applied from the main magnetic pole 61. In this case, the magnetization direction of the spin injection layer 30 and the applied magnetic field direction from the main magnetic pole 61 become approximately parallel. As a result, the magnetic field applied to the oscillation layer 10a from the main magnetic pole 61 and the spin torque applied to the oscillation layer 10a from the spin injection layer 30 are constantly balanced independently from the applied magnetic field direction from the main magnetic pole 61, and the stable oscillation can be performed. Therefore, even in the cases that the main magnetic pole 61 records "0" and "1" on the magnetic recording medium 80, the stable high-frequency magnetic field assist recording can be performed.

When the coercitivity of the spin injection layer 30 is larger than the magnetic field applied from the main magnetic pole 61, the magnetization direction of the spin injection layer 30 is magnetized to constantly approximately the same direction, independent from the applied magnetic field from the main magnetic pole 61. In this case, when the main magnetic pole 61 records "0", it is presumed that the stable oscillation can be performed. However, in the case of recording "1", the magnetic field from the main magnetic pole 61 is required to be inverted. As a result, the magnetic field applied from the main magnetic pole 61 to the oscillation layer 10a and the spin torque applied from the spin injection layer 30 to the oscillation layer 10a come not to be balanced, and the oscillation stops. Therefore, the stable high-frequency magnetic field assist recording becomes impossible. From the above reason, it is desirable that the coercitivity of the spin injection layer 30 is set to be smaller than the magnetic field applied from the main magnetic pole 61.

The components of the spin torque oscillator 10 have been described for the first embodiment previously, and therefore the description thereof will be omitted.

The main magnetic pole 61 and the return path 62 are composed of a soft magnetic layer that has a relatively large saturation magnetic flux density such as FeCo or CoFe or CoNiFe or NiFe or CoZrNb or FeN or FeSi or FeAlSi.

In the main magnetic pole 61, the materials of the portion of the side of the air bearing surface 61s and the portion except thereof may be different materials. That is, for example, for enhancing the magnetic field generated in the magnetic recording medium 80 or the spin torque oscillator 10, the material of the portion of the side of the air bearing surface 61s may be set to be FeCo, CoNiFe, FeN or the like having particularly large saturation magnetic flux density, and the material of the portion except thereof may be set to be NiFe or the like having particularly high magnetic permeability. For enhancing the magnetic field generated in the magnetic recording medium 80 or the spin torque oscillator 10, the shape of the main magnetic pole 61 in the side of the air bearing surface 61s may be smaller than the back gap portion. Thereby, the magnetic flux concentrates on the portion of the side of the air bearing surface 61s, and high intensity of the magnetic field can be generated.

For the coil of the main magnetic pole 61, a material such as Ti or Cu having low electric resistance and being difficult to be oxidized can be used.

According to the magnetic recording head 51 according to this embodiment having such a configuration, stable high-frequency magnetic field by the spin torque oscillator by which oscillation can be performed stably by the low current density and in which the intensity of the longitudinal high-frequency magnetic field is high can be obtained, and the magnetic recording head by which magnetic recording with high density can be realized can be provided.

The maximum region of the intensity Hac of the high-frequency magnetic field of the spin torque oscillator 10 exists in the reading side and the trailing side of the oscillation layer 10a. By adjusting the positions of the spin torque oscillator 10 and the main magnetic pole 61 and the shield 62 so that the maximum region of the recording magnetic field from the main magnetic pole 61 and the maximum region of the intensity Hac of the high-frequency magnetic field of the trailing side superpose with each other, good recording can be performed.

In the magnetic recording head 51 according to this embodiment, as the spin torque oscillator, the spin torque oscillator 10b described in the second embodiment can be used.

That is, in the oscillation layer 10a and in the interface side of the intermediate layer side of the spin injection layer 30, the first spin injection layer 30a made of a FeCoAl alloy is provided. Thereby, the spin torque transmission efficiency is further improved.

Therefore, further stable high-frequency magnetic field can be obtained by the spin torque oscillator which can perform oscillation further stably with the low current density and has the high intensity of the longitudinal high-frequency magnetic field, and the magnetic recording head which can realize magnetic recording with high density can be provided.

Also in this case, the maximum region of the intensity Hac of the high-frequency magnetic field of the spin torque oscillator 10b exists in the reading side and the trailing side of the oscillation layer 10a. By adjusting the positions of the spin torque oscillator 10b and the main magnetic pole 61 and the shield 62 so that the maximum region of the recording magnetic field from the main magnetic pole 61 and the maximum region of the intensity Hac of the high-frequency magnetic field of the trailing side superpose with each other, good recording can be performed.

Furthermore, in the magnetic recording head 51 according to this embodiment, the spin torque oscillator 10c described in the third embodiment can be used as the spin torque oscillator.

That is, on the interface side of the intermediate layer side of the spin injection layer 30, the first spin injection layer 30a made of the FeCoAl alloy is provided. Thereby, the spin torque transmission efficiency is improved.

The interface of the main magnetic pole 61 with the oscillation layer 10a can be Cu. Thereby, diffusion of the Al atoms of the oscillation layer 10a made of a FeCoAl alloy can be prevented. As a result, good spin torque oscillator can be fabricated.

Therefore, stable high-frequency magnetic field can be obtained by the spin torque oscillator which can perform oscillation stably with the low current density and has high the intensity of the longitudinal high-frequency magnetic field, and the magnetic recording head which can realize magnetic recording with high density can be provided.

Fifth Embodiment

Hereinafter, a magnetic recording apparatus and a magnetic head assembly according to a fifth embodiment of the invention will be described.

The magnetic recording head according to the embodiment of the invention described in the above description can be incorporated into, for example, a magnetic head assembly, of an integrated type of recording and reproducing, and can be installed on a magnetic recording apparatus. The magnetic recording apparatus according to this embodiment can have only the recording function, and can have both of the recording function and the reproducing function.

Figure 12:
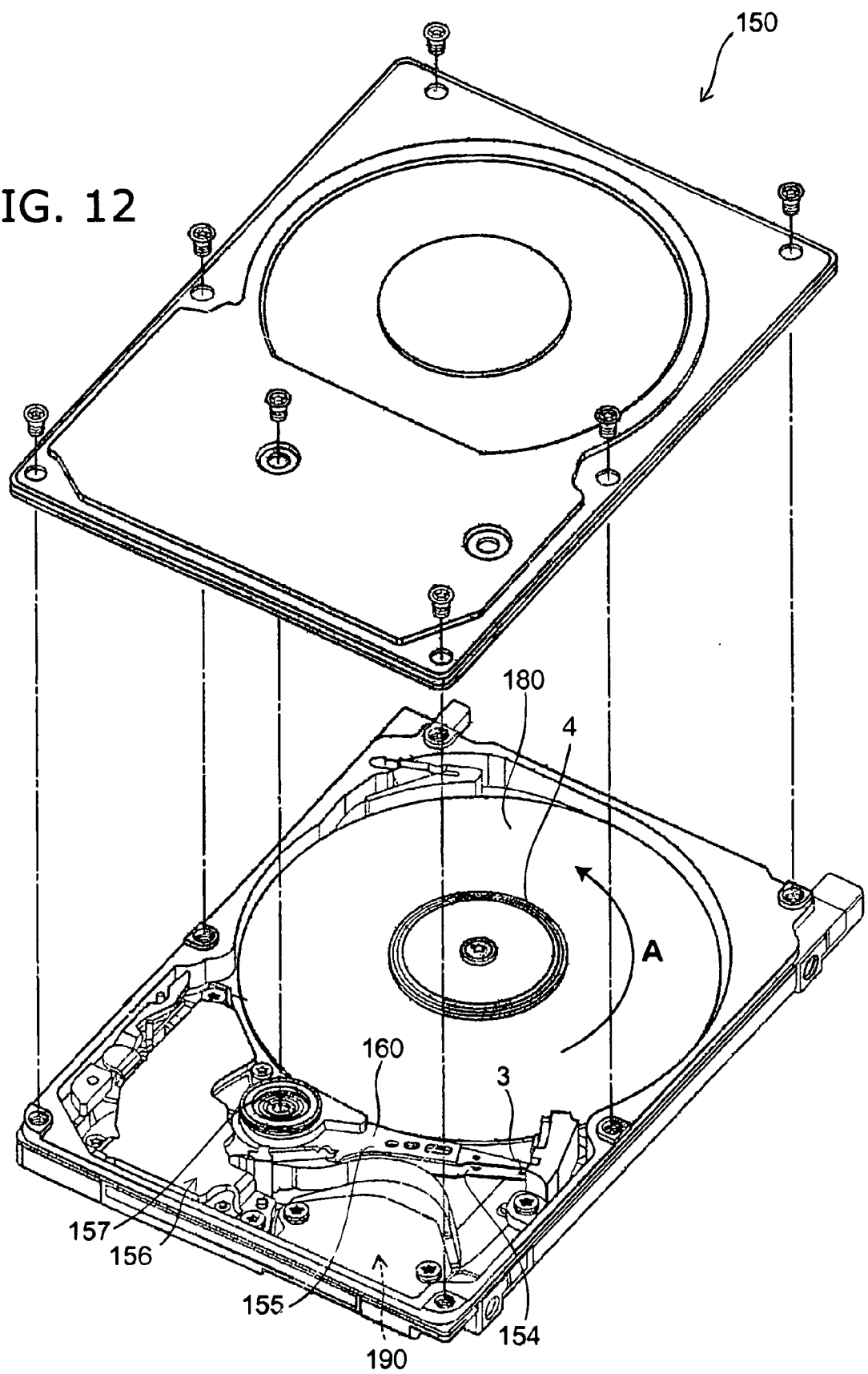
FIG. 12 is a schematic perspective view illustrating the configuration of a magnetic recording apparatus according to a fifth embodiment of the invention.

FIG. 12 is a schematic perspective view illustrating the configuration of the magnetic recording apparatus according to the fifth embodiment of the invention.

FIG. 13 is a schematic perspective view illustrating the configuration of part of the magnetic recording apparatus according to the fifth embodiment of the invention.

As shown in FIG. 12, a magnetic recording apparatus 150 according to the fifth embodiment of the invention is an apparatus of a type in which a rotary actuator is used. In FIG. 12, a recording medium disk 180 is loaded on a spindle motor 4, and rotates in the direction of the arrow A by a motor, which is not shown, responding to a control signal from a drive controller, which is not shown. The magnetic recording apparatus 150 according to this embodiment may include a plurality of the recording medium disks 180.

The head slider 3 for performing recording and reproducing of information to be stored in the recording medium disk 180 has such a configuration as described previously and is attached to a tip of a thin-film suspension 154. Here, the head slider 3 mounts, for example, the magnetic recording head according to the above embodiment in the vicinity of the end thereof.

When the recording medium disk 180 is rotated, the compression pressure by the suspension 154 and the pressure generated in the air bearing surface (ABS) of the head slider 3 are balanced, and the air bearing surface of the head slider 3 is held with a predetermined floatation amount from the surface of the recording medium disk 180. So-called "contact-traveling type" in which the head slider 3 is in contact with the recording medium disk 180 is also possible.

The suspension 154 is connected to one end of an actuator arm 155 having a bobbin for holding a driving coil, which is not shown. On the other end of the actuator arm 155, a voice coil motor 156 that is one kind of linear motors is provided. The voice coil motor 156 can be composed of, the driving coil, which is not shown, rolled up around the bobbin of the actuator arm 155, and a magnetic circuit consisting of a permanent magnet and an opposed yoke disposed to be opposed so as to sandwich the coil.

The actuator arm 155 is held by ball bearings, which is not shown, provided at two positions above and below a bearing 157, and can be rotated and slid by the voice coil motor 156. As a result, the magnetic recording head can be moved to an optional position on the recording medium disk 180.

Figure 13A:
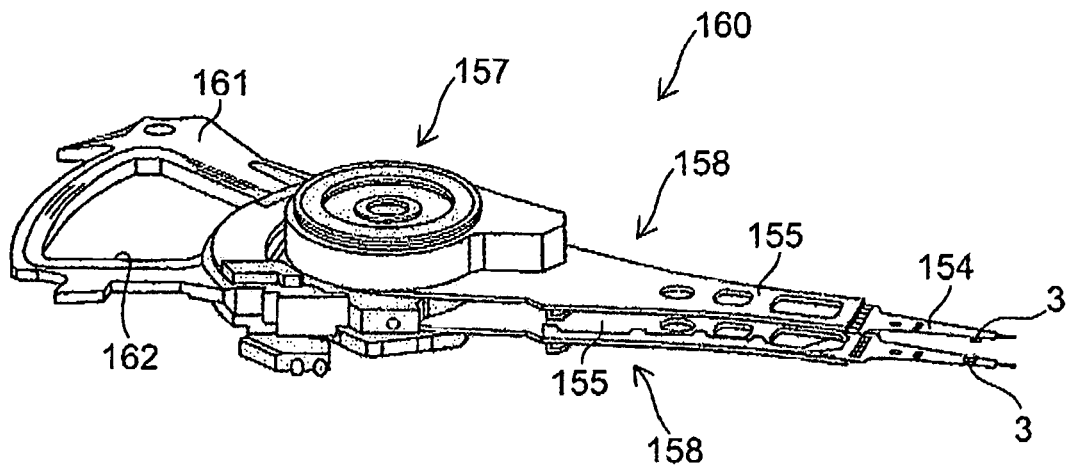
FIGS. 13A and 13B are schematic perspective views illustrating the configuration of part of the magnetic recording apparatus according to the fifth embodiment of the invention.
Figure 13B:
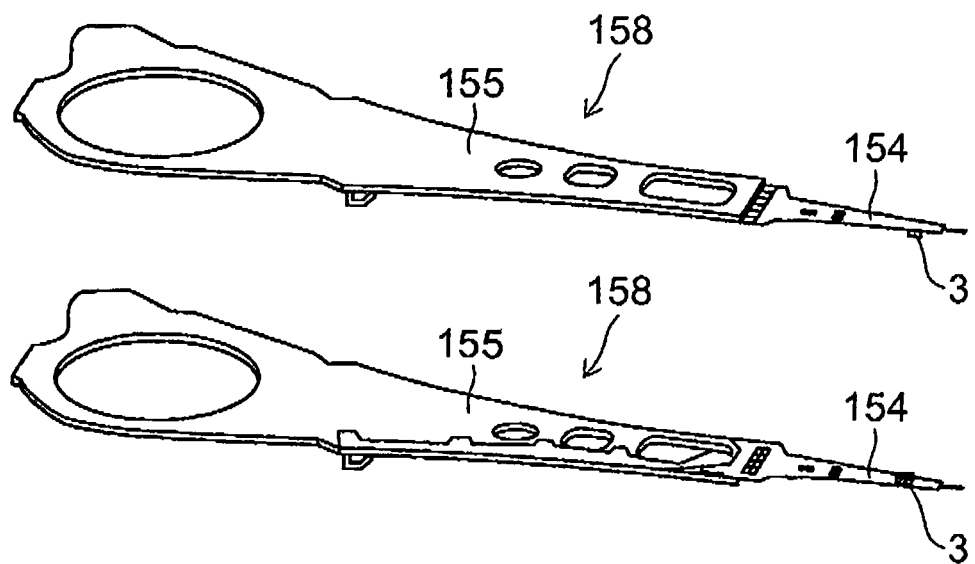

FIG. 13A illustrates the configuration of part of the magnetic recording apparatus according to this embodiment and is an enlarged perspective view of a head stack assembly 160. FIG. 13B is a perspective view illustrating a magnetic head assembly (head gimbal assembly) 158 serving as part of the head stack assembly 160.

As shown in FIG. 13A, the head stack assembly 160 includes the bearing 157, the head gimbal assembly 158 extending from the bearing 157, and a support frame 161 extending from the bearing part 157 in the opposite direction to the head gimbal assembly 158 and supporting a coil 162 of the voice coil motor.

As shown in FIG. 13B, the head gimbal assembly 158 includes the actuator arm 155 extending from the bearing 157 and the suspension 154 extending from the actuator arm 155.

To the tip of the suspension 154, the head slider 3 including the magnetic recording head according to the embodiment of the invention described previously is attached. And, as described previously, on the head slider 3, the magnetic recording head according to the embodiment of the invention is mounted.

That is, the magnetic head assembly (head gimbal assembly) 158 according to the embodiment of the invention includes the magnetic recording head according to the embodiment of the invention, the head slider 3 on which the magnetic recording head is mounted, the suspension 154 mounting the head slider 3 on one end thereof, and the actuator arm 155 connected to the other end of the suspension 154.

The suspension 154 has lead wires, which are not shown, for writing and reading signals, for heater for adjusting the floatation amount and for the spin torque oscillator (not shown), and the lead wires are electrically connected to the electrodes of the magnetic recording head incorporated into the head slider 3. Moreover, electrode pad, which is not shown, is provided in the head gimbal assembly 158. In this specific example, eight electrode pads are provided. That is, two electrode pads for the coil of the main magnetic pole 61, two electrode pads for the magnetic reproducing element 71, two electrode pads for DFH (dynamic flying height) and two electrode pads for the spin torque oscillator 10 are provided.

And, a signal processor 190 for writing and reading signals on the magnetic recording medium by using the magnetic recording head is provided. The signal processor 190 is, for example, provided on the back side of the drawing of the magnetic recording apparatus 150 illustrated in FIG. 12. The input and output lines of the signal processor 190 are connected to the electrode pad of the head gimbal assembly 158 and electrically coupled to the magnetic recording head.

As described above, the magnetic recording apparatus 150 according to this embodiment includes the magnetic recording medium, the magnetic recording head according to the above embodiment, a movable section by which the magnetic recording medium and the magnetic recording head can be relatively moved with opposed to each other in the state of being separated from each other or contacting each other, a position controller of positioning the magnetic recording head to a predetermined recording position on the magnetic recording medium, and the signal processor for writing and reading signals on the magnetic recording medium by using the magnetic recording head.

That is, as the above magnetic recording medium, the recording medium disk 180 is used.

The above movable section can include the head slider 3.

The above position controller can include the head gimbal assembly 158.

That is, the magnetic recording apparatus 150 according to this embodiment includes the magnetic recording medium, the magnetic head assembly according to the embodiment of the invention, and the signal processor for writing and reading signals on the magnetic recording medium by using the magnetic recording head mounted on the magnetic head assembly.

In the magnetic recording apparatus 150 according to this embodiment, by using the spin torque oscillator of the above embodiment and the magnetic recording head according to the above embodiment, stable high-frequency magnetic field can be obtained by the spin torque oscillator which enables oscillation to be performed stably by the low current density and which has the high intensity of the longitudinal high-frequency magnetic field, and then the magnetic recording apparatus which can realize magnetic recording with high density can be provided.

In the magnetic recording apparatus according to the embodiment of the invention, the spin torque oscillator 10 can be provided on the trailing side of the main magnetic pole 61. In this case, the magnetic recording layer 81 of the magnetic recording medium 80 is first opposed to the spin torque oscillator 10 and then opposed to the main magnetic pole 61.

In the magnetic recording apparatus according to the embodiment of the invention, the spin torque oscillator 10 can be provided on the reading side of the main magnetic pole 61. In this case, the magnetic recording layer 81 of the magnetic recording medium 80 is first opposed to the main magnetic pole 61 and then opposed to the spin torque oscillator 10.

Hereinafter, the magnetic recording medium that can be used for the magnetic recording apparatus of the above embodiment will be described.

Figure 14A:
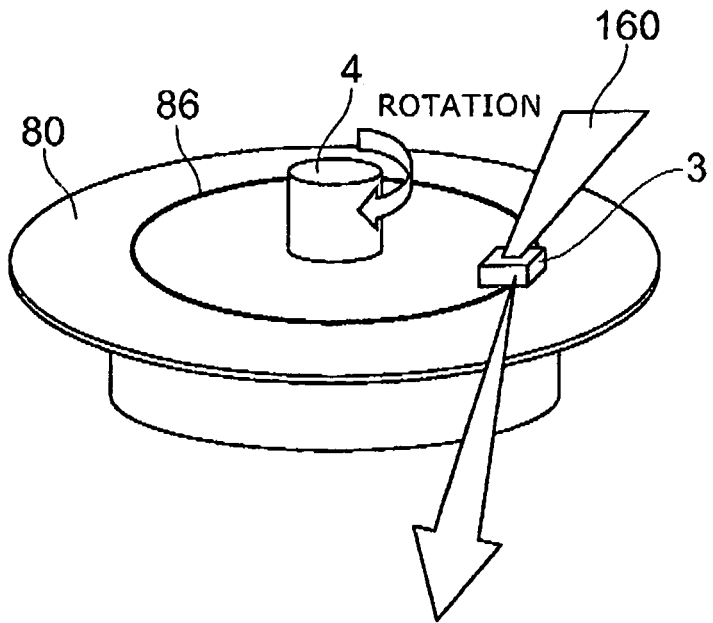
FIGS. 14A and 14B are schematic perspective views illustrating the configuration of the magnetic recording medium of the magnetic recording apparatus according to the embodiment of the invention.
Figure 14B:
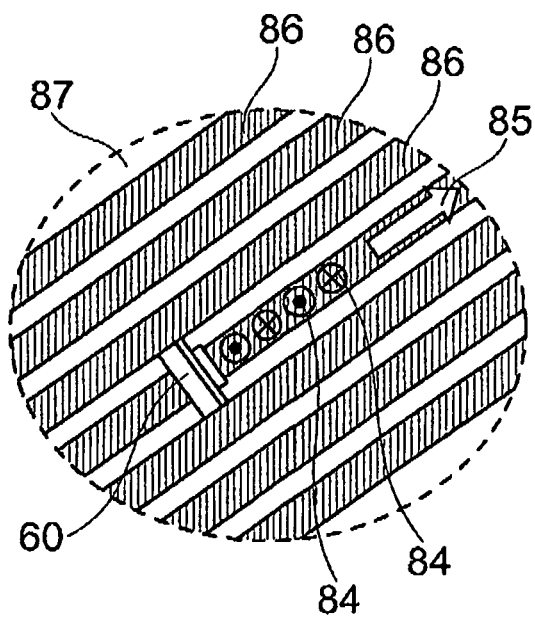

FIGS. 14A and 14B are schematic perspective views illustrating the configuration of the magnetic recording medium of the magnetic recording apparatus according to the embodiment of the invention.

As shown in FIG. 14, the magnetic recording medium 80 used for the magnetic recording apparatus according to the embodiment of the invention has magnetic discrete tracks (recording tracks) 86 of multiparticle that are separated from each other by a nonmagnetic body (or air) 87 and oriented perpendicularly. When the magnetic recording medium 80 is rotated by the spindle motor 4 and moves in the medium moving direction 85, any one of the magnetic recording heads of the above embodiments is provided and thereby a recording magnetization 84 can be formed.

As described above, in the magnetic recording apparatus according to the embodiment of the invention, the magnetic recording medium 80 can be the discrete track medium in which the adjacent recording tracks are formed through a non-magnetic member.

By setting the width (TS) of the spin track oscillator 10 in the recording track width direction to be from the width (TW) of the recording track 86 to the recording track pitch (TP), coercivity lowering of the adjacent recording tracks by the leaking high-frequency magnetic field generated from the spin torque oscillator 10 can be drastically suppressed. Therefore, in the magnetic recording medium 80 of this specific example, only the recording track 86 to be desired to be recorded can be effectively subjected to high-frequency magnetic field assist recording.

According to this specific example, as compared to the case of using so-called "blanket film" multiparticle perpendicular medium, it is easy to realize the high-frequency assist recording apparatus with narrow track, namely, high track density. By utilizing the high-frequency magnetic field assist recording scheme and further by using a magnetic medium material having high magnetic anisotropic energy (Ku) such as FePt or SmCo in which writing is impossible by a conventional magnetic recording head, the magnetic medium particles can be further finer to the size of nanometers, and thus, it is possible to realize the magnetic recording apparatus in which linear recording density is far higher than that of conventional technique also in the recording track direction (bit direction).

According to the magnetic recording apparatus according to this embodiment, in the discrete-type magnetic recording medium 80, recording can be reliably performed also on the magnetic recording layer having high coercivity, and thus high-density and high-speed magnetic recording becomes possible.

Figure 15A:
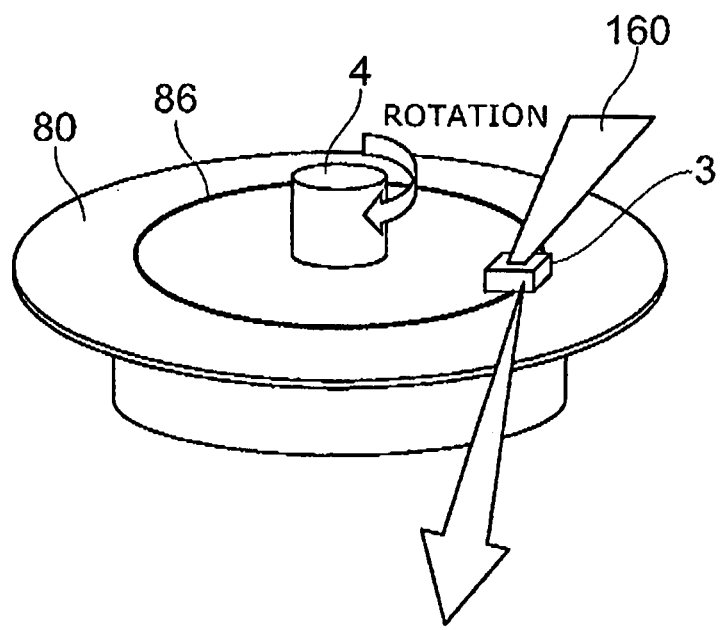
FIGS. 15A and 15B are schematic perspective views illustrating the configuration of another magnetic recording medium of the magnetic recording apparatus according to the embodiment of the invention.
Figure 15B:
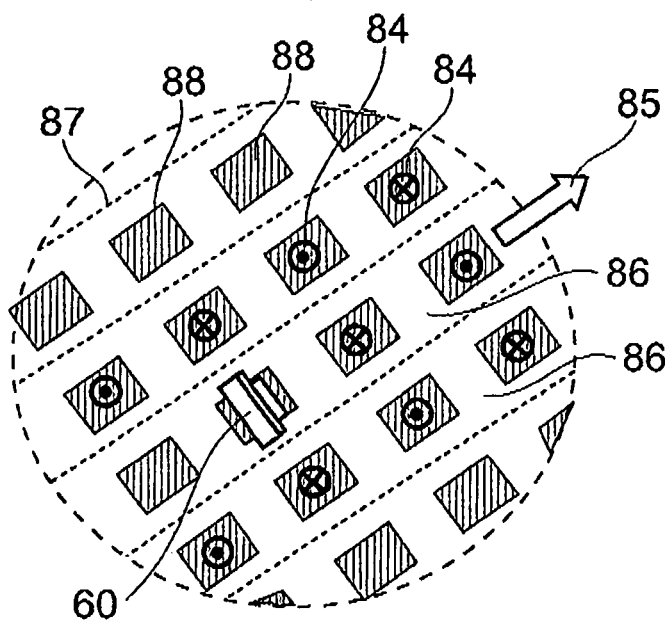

FIG. 15 is a schematic perspective view illustrating the configuration of another magnetic recording medium of the magnetic recording apparatus according to the embodiment of the invention.

As shown in FIG. 15, in another magnetic recording medium 80 that can be used for the magnetic recording apparatus according to the embodiment of the invention has magnetic discrete bits 88 that are separated from one another by the non-magnetic body 87. When the magnetic recording medium 80 is rotated by the spindle motor 4 and moves in the medium moving direction 85, the recording magnetization 84 can be formed by the magnetic recording head according to the embodiment of the invention.

As described above, in the magnetic recording apparatus according to the embodiment of the invention, the magnetic recording medium 80 can be the discrete bit medium in which the independent recording magnetic dots are regularly arranged and formed through a non-magnetic member.

According to the magnetic recording apparatus according to this embodiment, in the discrete-type magnetic recording medium 80, recording can be reliably performed also on the magnetic recording layer having high coercivity, and thus high-density and high-speed magnetic recording becomes possible.

Also in this specific example, by setting the width (TS) of the spin track oscillator 10 in the recording track width direction to be from the width (TW) of the recording track 86 to the recording track pitch (TP), coercivity lowering of the contiguous recording tracks by the leaking high-frequency magnetic field generated from the spin torque oscillator 10 can be drastically suppressed. Therefore, only the recording track 86 to be desired to be recorded can be effectively subjected to high-frequency magnetic field assist recording. According to this specific example, as long as the resistance to thermal fluctuation under the operating environment can be held, by increasing magnetic anisotropic energy (Ku) of the magnetic discrete bit 88 and downscaling it, there is a possibility of realizing the high-frequency magnetic field assist recording apparatus with a high recording density of 10 Tbits/inch$^2$ or more.

As described above, the embodiments of the invention have been described with reference to specific examples. However, the invention is not limited to the specific examples. For example, the specific configuration of each of the components composing the spin torque oscillator, the magnetic recording head, the magnetic head assembly, and the magnetic recording apparatus is included in the scope of the invention, as long as the invention can be carried out by appropriate selection from the known range by those skilled in the art and the same effect can be obtained.

Moreover, combination of two or more components of the respective specific examples in the technically possible range is included in the scope of the invention as long as including the spirit of the invention.

In addition, all of the spin torque oscillators, the magnetic recording heads, the magnetic head assemblies, and the magnetic recording apparatuses that can be carried out with appropriately design-modified by those skilled in the art on the basis of the spin torque oscillators, the magnetic recording heads, the magnetic head assemblies, and the magnetic recording apparatuses described above as the embodiments of the invention belong to the scope of the invention as long as including the spirit of the invention.

In addition, it is understood that those skilled in the art can achieve various variations and modified examples and that the variations and the modified examples belong to the scope of the invention.

The invention claimed is:

1. A magnetic recording apparatus comprising:
   a magnetic head assembly including:
      a magnetic recording head including:
         a spin torque oscillator including:
            an oscillation layer including a Fe—Co alloy containing at least one selected from the group consisting of Al, Si, Ge, Mn, Cr, and B, the Fe—Co alloy having bcc structure, and an Fe composition of the Fe—Co alloy being 20 atomic % or more, the oscillation layer having a thickness from 5-20 nanometers and a saturation magnetization from 500-1300 emu/cc,
            a spin injection layer including a magnetic film with an anisotropy perpendicular to a film surface of the magnetic film, and
            an intermediate layer provided between the oscillation layer and the spin injection layer; and
         a main magnetic pole placed together with the spin torque oscillator;
      a head slider, the magnetic recording head being mounted on the head slider;
      a suspension, the head slider being mounted on a first end of the suspension; and
      an actuator arm connected to a second end of the suspension;
   a magnetic recording medium; and
   a signal processor configured to write and read a signal on the magnetic recording medium using the magnetic recording head.

2. The apparatus according to claim 1, wherein a coercitivity of the oscillation layer is lower than a magnetic field applied from the main magnetic pole, and a coercitivity of the spin injection layer is lower than a magnetic field applied from the main magnetic pole.

3. The apparatus according to claim 1, wherein the oscillation layer is disposed between the main magnetic pole and the spin injection layer.

4. The apparatus according to claim 1, wherein the spin injection layer is disposed between the main magnetic pole and the oscillation layer.

5. The apparatus according to claim 1, wherein the oscillation layer is a Fe—Co—Al alloy, and an Al composition of the Fe—Co—Al alloy is 12 atomic % or more and 40 atomic % or less.

6. The apparatus according to claim 1, wherein the spin injection layer includes a Fe—Co—Al alloy at the interface between the spin injection layer and the intermediate layer, and an Al composition of the Fe—Co—Al alloy is 12 atomic % or more and 40 atomic % or less.

7. The apparatus according to claim 1, wherein the magnetic film includes at least of CoCrPt, CoCrTa, CoCrTaPt, CoCrTaNb and TbFeCo.

8. The apparatus according to claim 1, wherein the magnetic film includes an artificial lattice portion including at least one of Co/Pd, Co/Pt and CoCrTa/Pd.

9. The apparatus according to claim 1, wherein the magnetic film includes at least one of a CoCr-based alloy, a RE-TM-based amorphous alloy, a Co artificial lattice, a CoPt-based alloy, a FePt-based alloy and a SmCo-based alloy.

* * * * *